US008964457B2

(12) United States Patent
Liaw

(10) Patent No.: US 8,964,457 B2
(45) Date of Patent: Feb. 24, 2015

(54) METHODS FOR OPERATING SRAM CELLS

(71) Applicant: Taiwan Semiconductor Manufacturing Company, Ltd., Hsin-Chu (TW)

(72) Inventor: Jhon-Jhy Liaw, Zhudong Township (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 10 days.

(21) Appl. No.: 13/750,864

(22) Filed: Jan. 25, 2013

(65) Prior Publication Data

US 2014/0153323 A1 Jun. 5, 2014

Related U.S. Application Data

(63) Continuation-in-part of application No. 13/691,373, filed on Nov. 30, 2012, now Pat. No. 8,830,732.

(51) Int. Cl.
| | |
|---|---|
| *G11C 11/00* | (2006.01) |
| *G11C 11/419* | (2006.01) |
| *G11C 11/412* | (2006.01) |
| *H01L 27/02* | (2006.01) |
| *H01L 27/11* | (2006.01) |

(52) U.S. Cl.
CPC ............ *G11C 11/419* (2013.01); *G11C 11/412* (2013.01); *H01L 27/0207* (2013.01); *H01L 27/1104* (2013.01)
USPC ........ 365/156; 365/49.11; 365/154; 365/188; 365/181; 365/189.011; 365/189.15; 365/189.05; 365/202; 365/207

(58) Field of Classification Search
CPC .... G11C 15/04; G11C 11/412; G11C 11/413; G11C 11/39

USPC ............... 365/49.11, 154, 188, 181, 189.011, 365/189.15, 189.05, 202, 207
See application file for complete search history.

(56) References Cited

U.S. PATENT DOCUMENTS

| | | | |
|---|---|---|---|
| 4,623,989 | A | 11/1986 | Blake |
| 6,522,562 | B2 | 2/2003 | Foss |
| 7,250,657 | B2 | 7/2007 | Liaw |
| 7,674,703 | B1 | 3/2010 | Schiwon et al. |
| 8,315,084 | B2 | 11/2012 | Liaw et al. |

(Continued)

OTHER PUBLICATIONS

Choi, Munkang et al., "14 nm FinFET Stress Engineering with Epitaxial SiGe Source/Drain," International Silicon-Germanium Technology and Device Meeting (ISTDM), Jun. 4-6, 2012, 2 pages.

*Primary Examiner* — Fernando Hidalgo
(74) *Attorney, Agent, or Firm* — Slater & Matsil, L.L.P.

(57) ABSTRACT

A circuit includes a Static Random Access Memory (SRAM) array. An SRAM cell is in the SRAM array and includes a p-well region, a first and a second n-well region on opposite sides of the p-well region, and a first and a second pass-gate FinFET. The first pass-gate FinFET and the second pass-gate FinFET are p-type FinFETs. A CVss line is over the p-well region, wherein the CVss line is parallel to an interface between the p-well region and the first n-well region. A bit-line and a bit-line bar are on opposite sides of the CVss line. A CVdd line crosses over the SRAM cell. A CVss control circuit is connected to the CVss line. The CVss control circuit is configured to provide a first CVss voltage and a second CVss voltage to the CVss line, with the first and the second CVss voltage being different from each other.

20 Claims, 28 Drawing Sheets

(56) References Cited

U.S. PATENT DOCUMENTS

| | | | |
|---|---|---|---|
| 8,593,890 B2* | 11/2013 | Adams et al. | 365/189.16 |
| 2004/0170926 A1 | 9/2004 | Chandhok | |
| 2006/0215441 A1* | 9/2006 | Matsushige et al. | 365/154 |
| 2007/0235765 A1 | 10/2007 | Liaw | |
| 2008/0299780 A1 | 12/2008 | Elliott et al. | |
| 2009/0014798 A1 | 1/2009 | Zhu et al. | |
| 2010/0296334 A1 | 11/2010 | Houston et al. | |
| 2011/0222332 A1 | 9/2011 | Liaw et al. | |
| 2012/0147680 A1* | 6/2012 | Koike | 365/189.011 |
| 2012/0163068 A1* | 6/2012 | Houston | 365/156 |
| 2012/0230088 A1 | 9/2012 | Houston | |
| 2012/0243302 A1* | 9/2012 | Nii et al. | 365/154 |
| 2012/0299106 A1 | 11/2012 | Mann | |

* cited by examiner

US 8,964,457 B2

METHODS FOR OPERATING SRAM CELLS

This application is a continuation-in-part application of commonly-assigned U.S. patent application Ser. No. 13/691,373, filed Nov. 30, 2012, and entitled "SRAM Cell Comprising FinFETs," which application is hereby incorporated herein by reference.

BACKGROUND

Static Random Access Memory (SRAM) is commonly used in integrated circuits. SRAM cells have the advantageous feature of holding data without a need for refreshing. With the increasing demanding requirement to the speed of integrated circuits, the read speed and write speed of SRAM cells also become more important. Furthermore, enough read margin and write margins are required to achieve reliable read and write operations, respectively. With the increasingly scaling down of the already very small SRAM cells, however, such request becomes increasingly demanding.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are illustrative, and do not limit the scope of the disclosure.

A Static Random Access Memory (SRAM) cell is provided in accordance with various exemplary embodiments. The variations of the embodiments are discussed. Throughout the various views and illustrative embodiments, like reference numbers are used to designate like elements.

Figure 1:
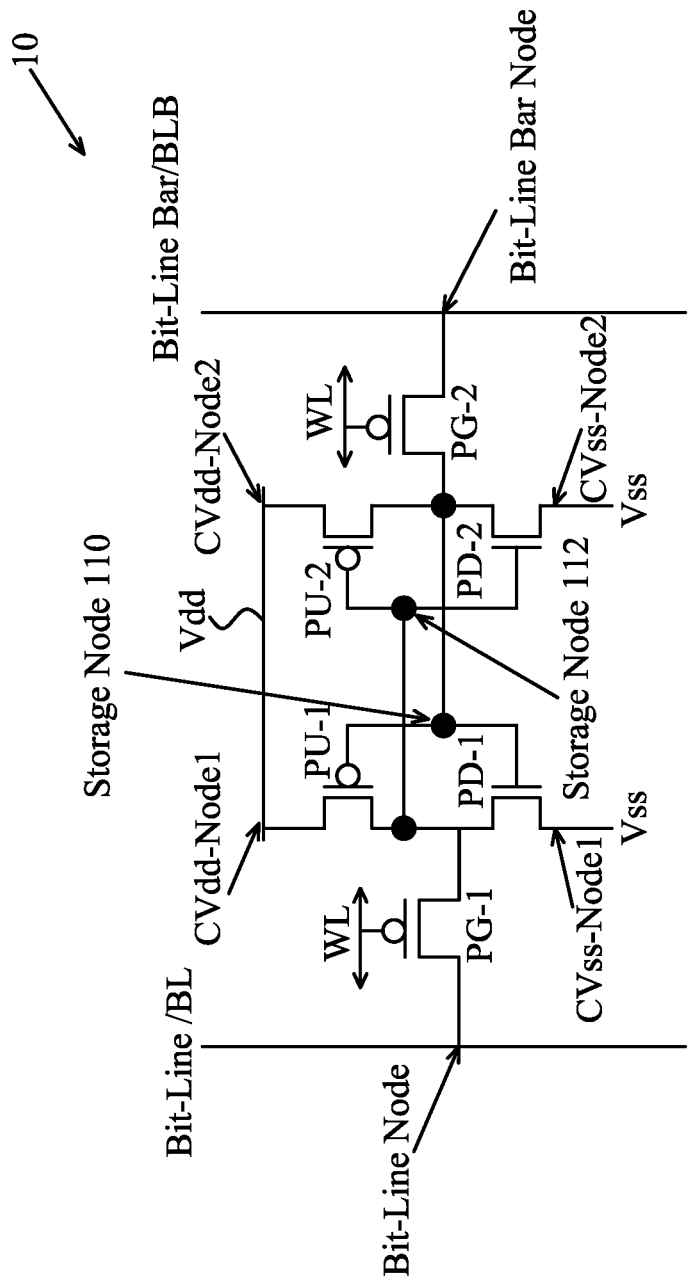
FIGS. 1 and 2 are circuit diagrams of a Static Random Access Memory (SRAM) cell in accordance with exemplary embodiments.

FIG. 1 illustrates a circuit diagram of SRAM cell 10 in accordance with some embodiments. SRAM cell 10 includes pass-gate transistors PG-1 and PG-2, pull-up transistors PU-1 and PU-2, which are P-type Metal-Oxide-Semiconductor (PMOS) transistors, and pull-down transistors PD-1 and PD-2, which are N-type Metal-Oxide-Semiconductor (NMOS) transistors. Pass-gate transistors PG-1 and PG-2 are P-type transistors in accordance with some embodiments. The gates of pass-gate transistors PG-1 and PG-2 are connected to, and controlled by, word-line WL that determines whether SRAM cell 10 is selected or not. A latch formed of pull-up transistors PU-1 and PU-2 and pull-down transistors PD-1 and PD-2 stores a bit, wherein the complementary values of the bit are stored in storage node 110 and storage node 112. The stored bit can be written into, or read from, SRAM cell 10 through Bit-line line (BL) and Bit-Line Bar (BLB), wherein BL and BLB may carry complementary bit-line signals. SRAM cell 10 is powered through a positive power supply node Vdd that has a positive power supply voltage (also denoted as Vdd). SRAM cell 10 is also connected to power supply voltage Vss, which may be an electrical ground.

The sources of pull-up transistors PU-1 and PU-2 are connected to CVdd-node1 and CVdd-node2, respectively, which are further connected to power supply voltage Vdd. Power supply voltage Vdd may be carried by metal lines CVdd-line, CVdd-line-1, and CVdd-line-2, as shown in FIGS. 11 through 21. The sources of pull-down transistors PD-1 and PD-2 are connected to CVss-node1 and CVss-node2, respectively, which are further connected to power supply voltage Vss. Voltage Vss may be carried by metal lines CVss-line, CVss-line-1, and CVss-line-2, as also shown in FIGS. 11 through 21. The gates of transistors PU-1 and PD-1 are connected to the drains of transistors PU-2 and PD-2, which connection node is storage node 110. The gates of transistors PU-2 and PD-2 are connected to the drains of transistors PU-1 and PD-1, which connection node is storage node 112. A source/drain region of pass-gate transistor PG-1 is connected to Bit-line BL at a Bit-line node. A source/drain region of pass-gate transistor PG-2 is connected to Bit-line bar BLB at a Bit-line bar node.

Figure 2:
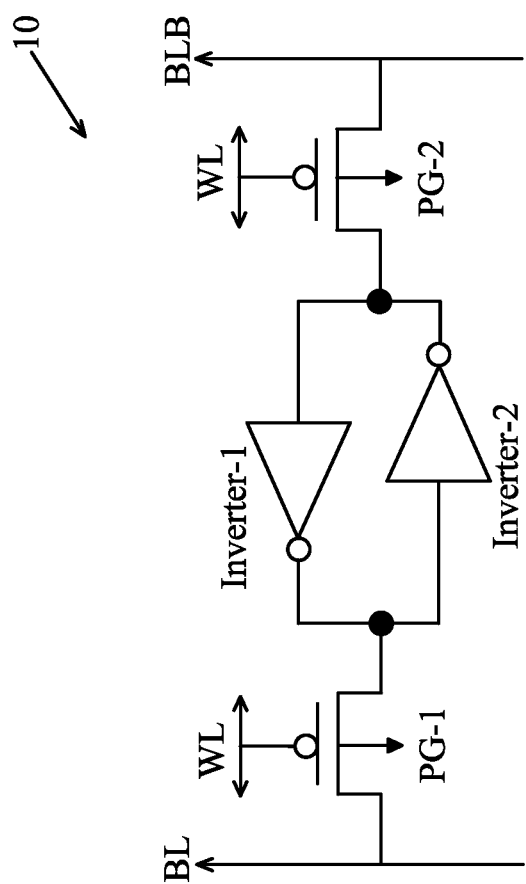

FIG. 2 illustrates an alternative circuit diagram of SRAM cell 10, wherein transistors PU-1 and PD-1 in FIG. 1 are represented as first inverter Inverter-1, and transistors PU-2 and PD-2 are represented as second inverter Inverter-2. The output of first inverter Inverter-1 is connected to transistor PG-1 and the input of the second inverter Inverter-2. The output of second inverter Inverter-2 is connected to transistor PG-2 and the input of second inverter Inverter-2.

Figure 3:
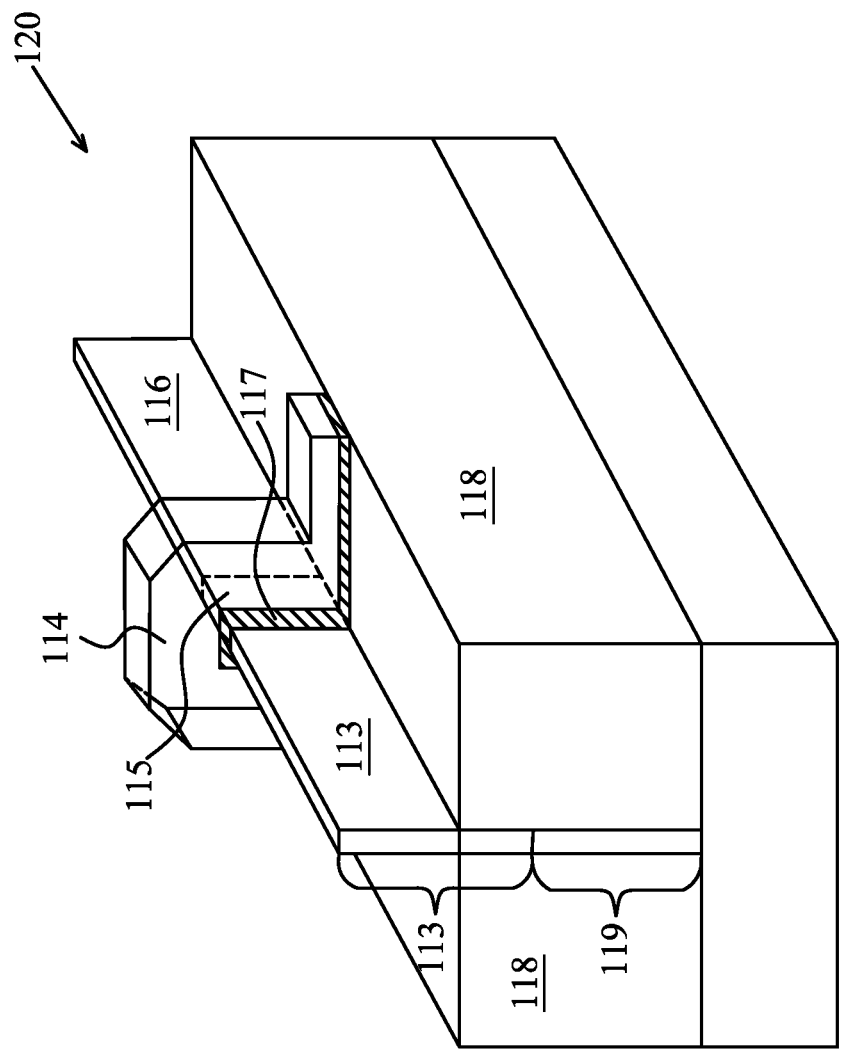
FIG. 3 is a perspective view of a Fin Field-Effect Transistor (FinFET)

FIG. 3 illustrates a perspective view of FinFET transistor 120, which may be any of the FinFETs in SRAM cell 10, including PG-1, PU-1, PD-1, PG-2, PU-2, and PD-2. FinFET 120 includes gate dielectric 117, gate electrode 114, and a semiconductor fin, which includes center fin portion 115, drain region 113, and source region 116. Isolation regions 118 are formed on opposite sides of semiconductor strip 119, over which fin portion 115 is located. Fin portion 115 may be aligned to, and may comprise a same material as, semiconductor strip 119 in some exemplary embodiments. Fin portion 115, drain region 113, and source region 116 in combination represents semiconductor fins 14, 20, 34, and/or 40 (for example, FIGS. 5 through 8) throughout the layouts of the present disclosure. Isolation regions 118 may be Shallow Trench Isolation (STI) regions, although field oxide regions may be used. Gate dielectric 117 and gate electrode 114 comprise portions on the sidewalls and a top surface of fin portion 115. Accordingly, the channel between drain region 113 and source region 116 includes sidewall portions and the top surface portion of semiconductor fin 115.

In some embodiments, drain region 113 and source regions 116 of p-type FinFETs PG-1, PG-2, PU-1, and PU-2 are formed by implanting end portions of the semiconductor fin with a p-type impurity such as boron, indium, or the like. In alternative embodiments, drain region 113 and source regions 116 are formed by etching end portions of original fin (such as fins 14 and 34 in FIGS. 5 through 8) to form recesses, and growing epitaxy regions in the recesses. The epitaxy regions may include Si, SiGe, SiGe C, Ge, or combinations thereof. Accordingly, in FIG. 3, drain region 113 and source regions 116 may comprise silicon germanium in some exemplary embodiments, while the underlying semiconductor strip may be silicon strips. P-type impurities may be in-situ doped in the source and drain regions during the epitaxy. By forming the epitaxy regions, the drive currents Ion of pass-gate FinFETs PU-1 and PU-2 may be stronger than the drive currents Ion of pull-down transistor PD-1 and PD-2 by at least 5% or greater.

Figure 4:
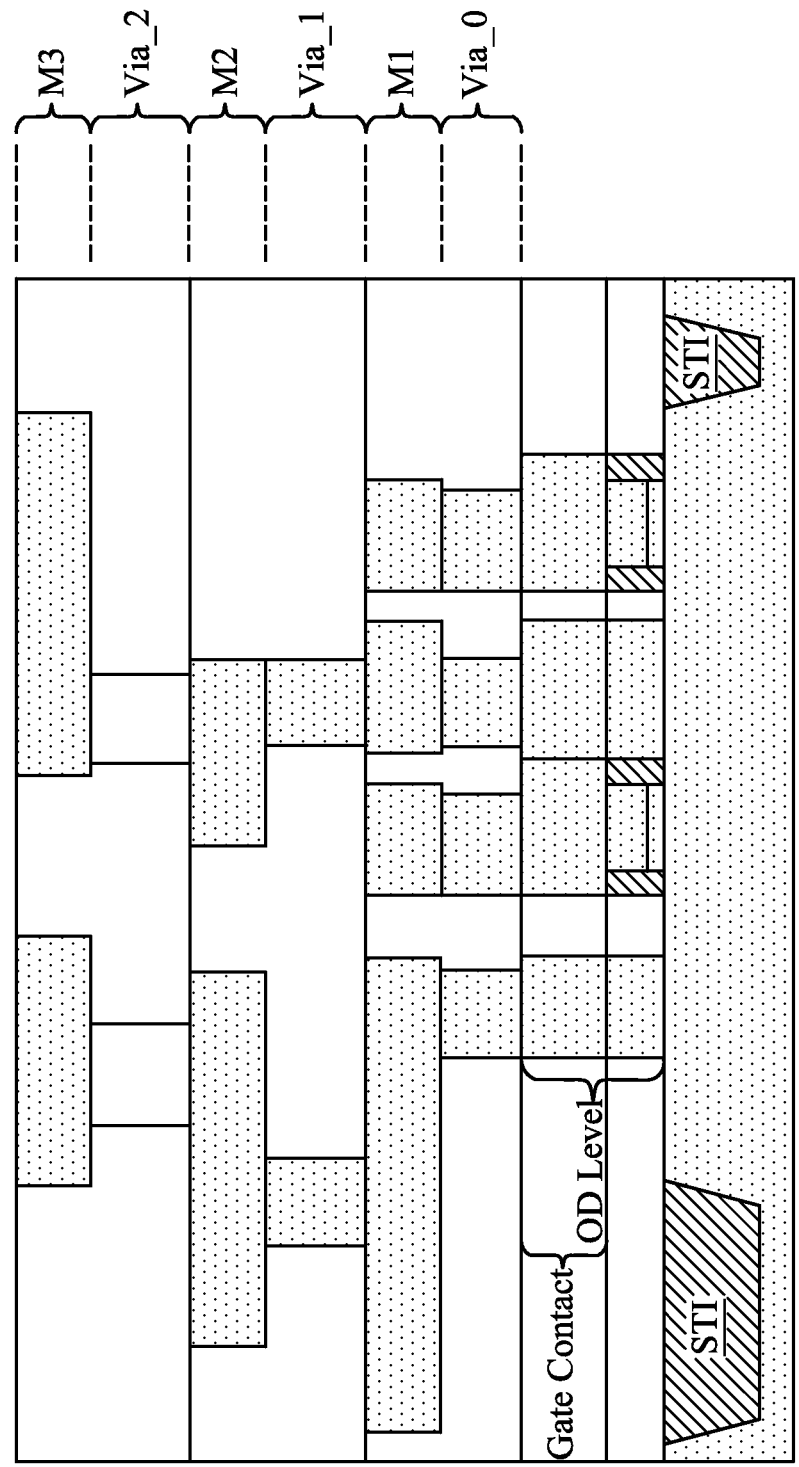
FIG. 4 illustrates a schematic cross-sectional view illustrating layers of an SRAM cell.

FIG. 4 illustrates a schematic cross-sectional view of SRAM cell 10, which layers are formed on a semiconductor chip or wafer. It is noted that FIG. 4 is schematically illustrated to show various levels of interconnect structure and transistors, and may not reflect the actual cross-sectional view of SRAM cell 10. The interconnect structure includes gate contact level, an OD (wherein the term "OD" represents "active region") level, via levels Via_0, Via_1, and Via_2, and metal layers M1, M2, and M3. Each of the levels and layers includes one or more dielectric layers and the conductive features formed therein. The conductive features that are at the same level may have top surfaces substantially level to each other, bottom surfaces substantially level to each other, and may be formed simultaneously. The features in the gate contact level connects gate electrodes of transistors (such as the illustrated exemplary transistors PU-1 and PU-2) to an overlying level such as the Via_0 level. The features in the OD level connects source and drain regions of transistors, pickup regions of well regions, and the like to an overlying level such as the Via_0 level.

Figure 5:
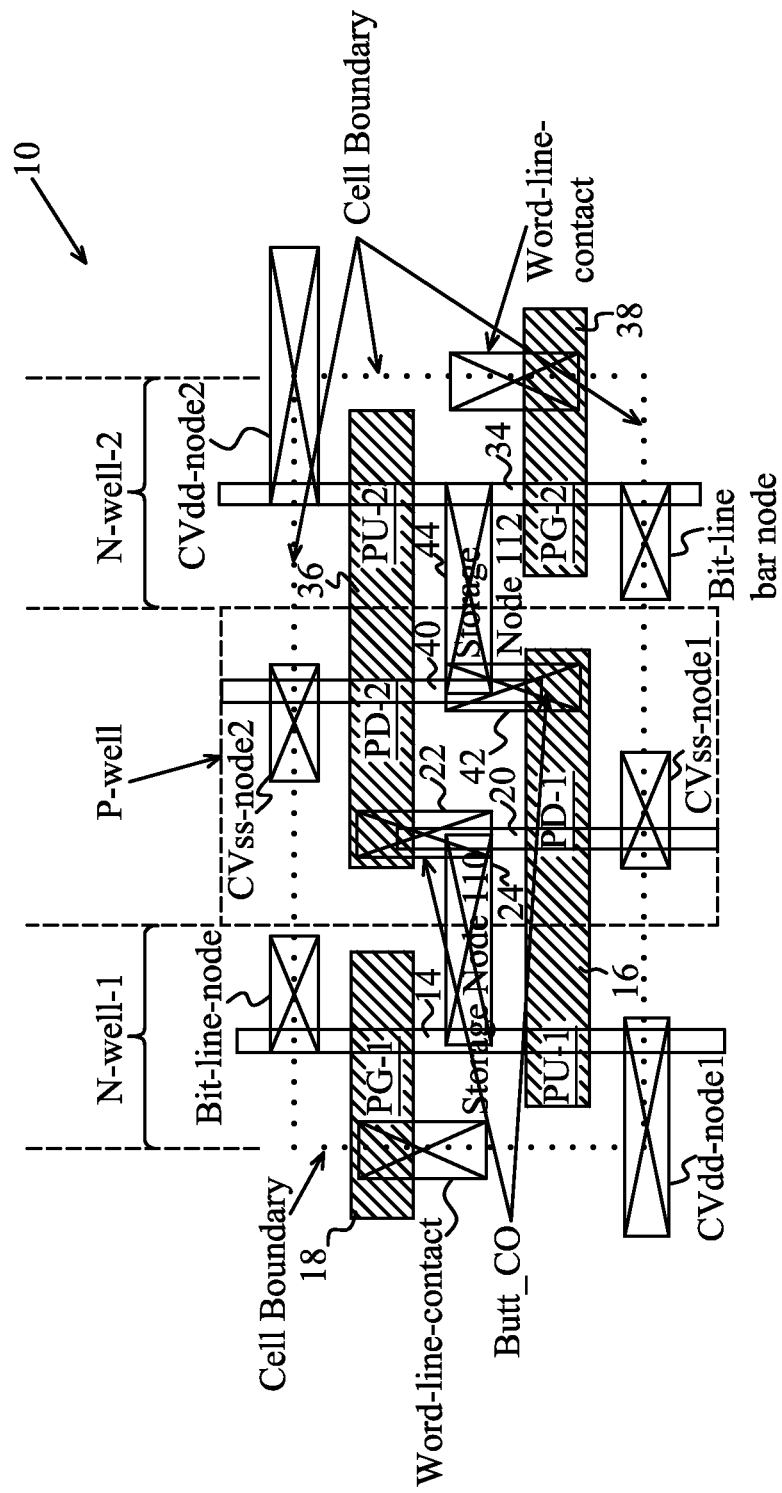
FIGS. 5-8 are layouts of some exemplary SRAM cells in accordance with various embodiments.

FIG. 5 illustrates a layout of SRAM cell 10 in accordance with exemplary embodiments. The outer boundaries of SRAM cell 10 are illustrated using dashed lines, which form a rectangle. Nodes CVdd-node1, CVdd-node2, CVss-node1, CVss-node2, bit-line-node, and bit-line bar node, which are shown in FIG. 1, are also illustrated in FIG. 5. Also, some other nodes such as Word-line contacts are also illustrated in FIG. 5. Gate electrode 16 forms pull-up transistor PU-1 with the underlying semiconductor fin 14. Gate electrode 16 further forms pull-down transistor PD-1 with the underlying semiconductor fin 20. Gate electrode 18 forms pass-gate transistor PG-1 with the underlying semiconductor fin 14, which is the same fin that also forms pull-up transistor PU-1. Gate electrode 36 forms pull-up transistor PU-2 with the underlying semiconductor fin 34. Gate electrode 36 further forms pull-down transistor PD-2 with the underlying semiconductor fin 40. Gate electrode 38 forms pass-gate transistor PG-2 with the underlying semiconductor fin 34, which is the same fin that also form pull-up transistor PU-2.

SRAM cell 10 includes a P-well region and two N-well regions N-well-1 and N-well-2 on opposite sides of the P-well region. A first butted contact plug Butt-CO is used to electrically connect gate electrode 36 of transistors PU-2 and PD-2 to the drain region of transistor PD-1, and a second butted contact plug Butt-CO is used to electrically connect gate electrode 16 of transistors PU-1 and PD-1 to the drain region of transistor PD-2. Butted contacts Butt-CO are formed in the contact level and the OD level in FIG. 4. Long contact 24 is used to connect fin 14 (the drain region of FinFET PU-1) to fin 20 and the first butted contact Butt-CO, wherein long contact 24 and the first butted contact Butt-CO form storage node 110 (also refer to FIG. 1). Long contact 24 has a longitudinal direction perpendicular to the longitudinal directions of fins 14, 20, 34, and 40. Long contact 44 is used to connect fin 34 (the drain region of FinFET PU-2) to fin 40 and the second butted contact Butt-CO, wherein long contact 44 and the second butted contact Butt-CO form storage node 112 (also refer to FIG. 1). Long contact 44 has a longitudinal direction parallel to the longitudinal direction of long contact 24.

Figure 6:
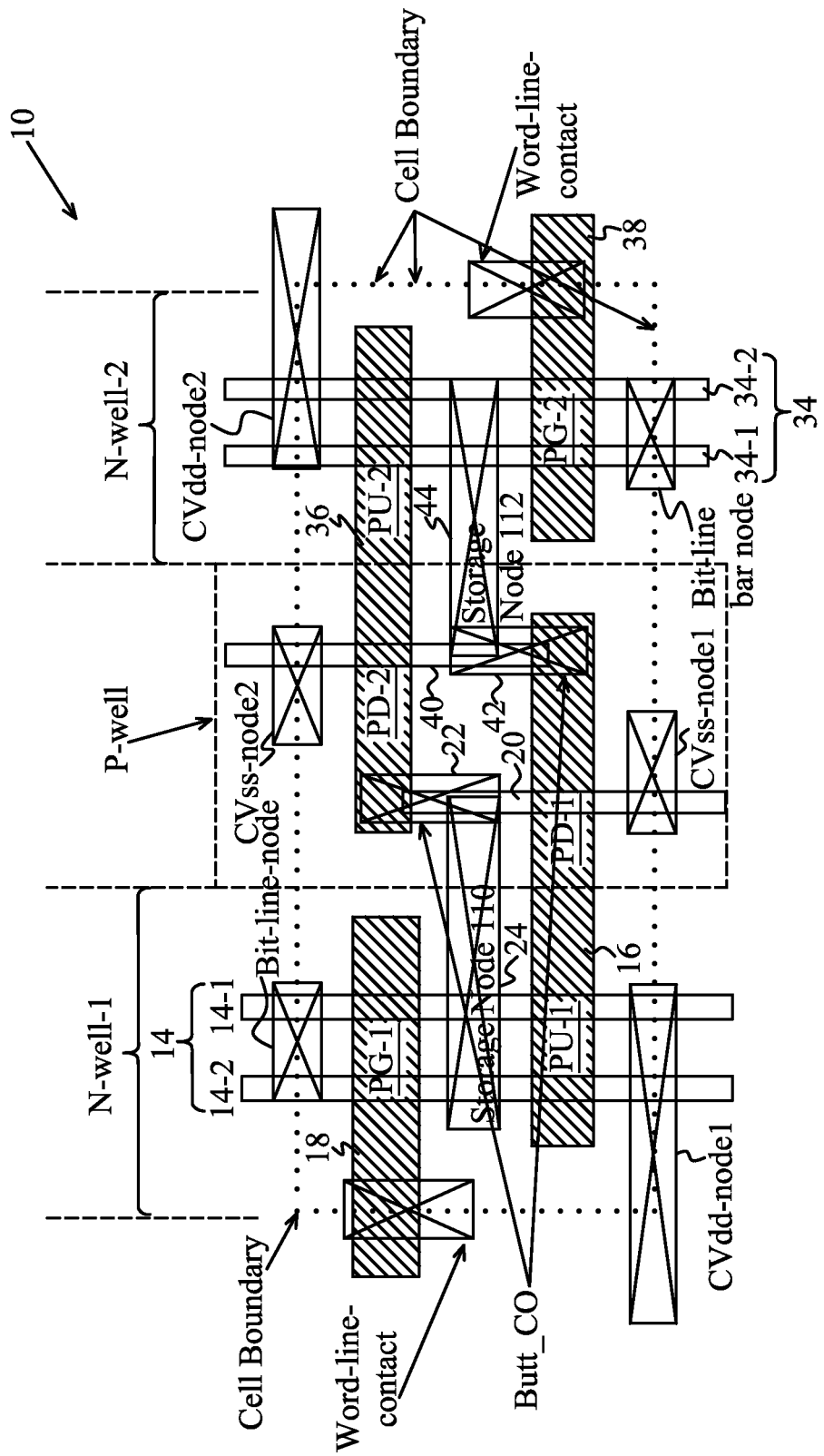
Figure 7:
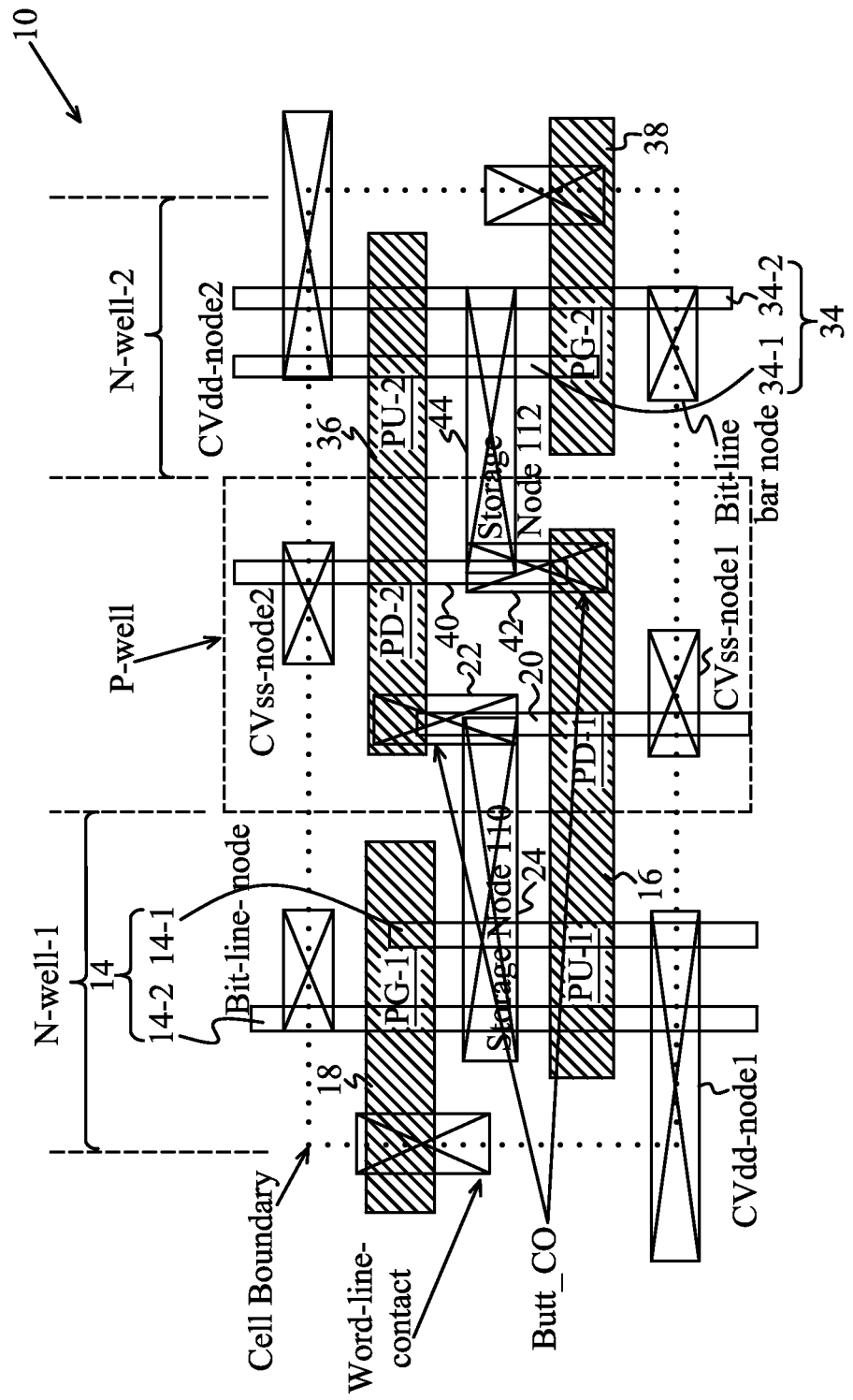
Figure 8:
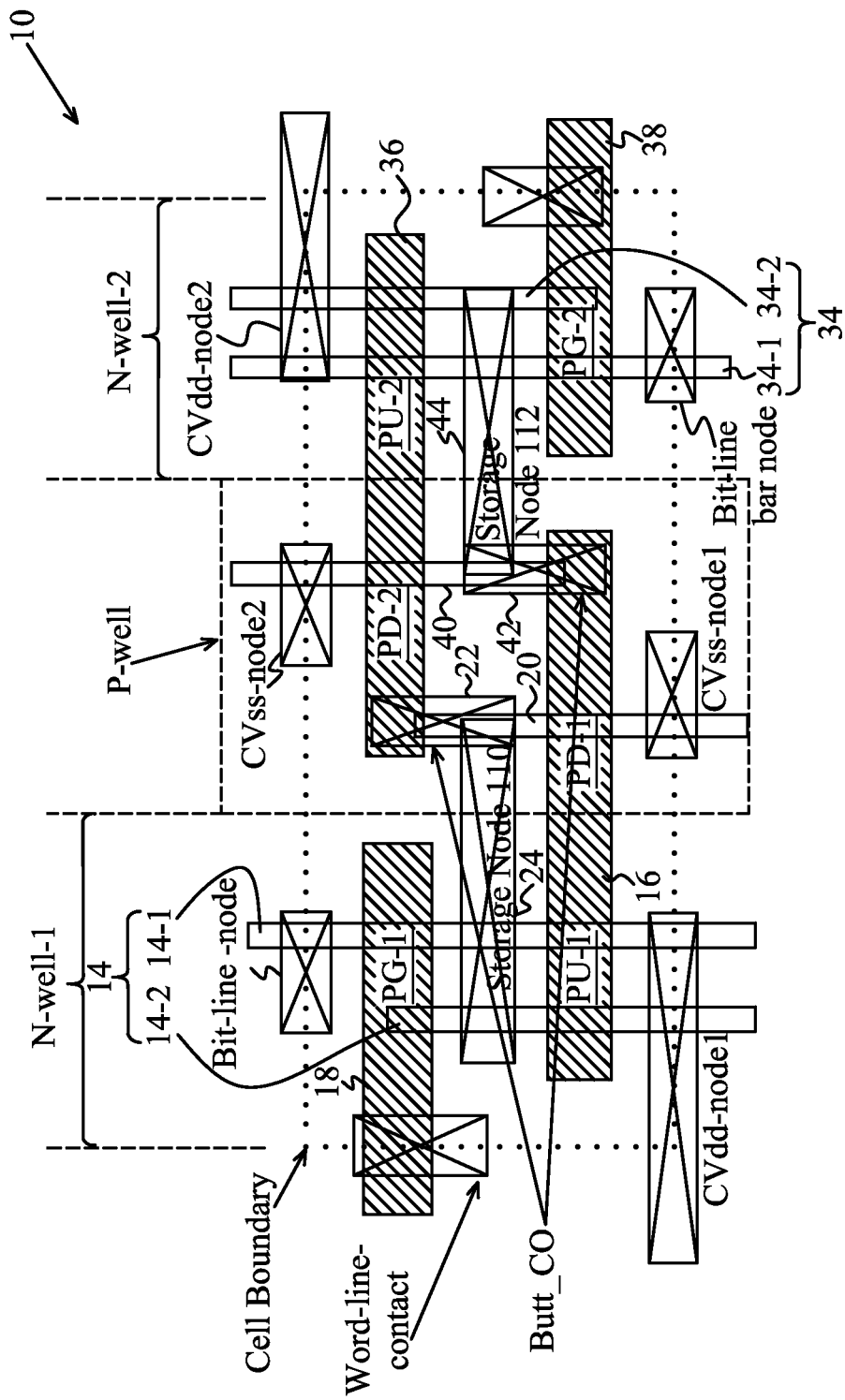

FIGS. 6 through 8 illustrate the layouts of SRAM cell 10 in accordance with alternative embodiments. Unless specified otherwise, the components in subsequently discussed embodiments are essentially the same as the like components, which are denoted by like reference numerals in the embodiments shown in FIGS. 1 through 5. The details regarding the components shown in the subsequently discussed embodiments may thus be found in the discussion of the embodiment shown in FIGS. 1 through 5.

FIG. 6 illustrates SRAM cell 10, which is similar to the embodiments in FIG. 5, except that each of p-type FinFETs PG-1, PU-1, PG-2, and PU-2 may be a multi-fin FinFET comprising a plurality of (such as two, three, four, or more) semiconductor fins. Pull-down FinFETs PD-1 and PD-2 may be single-fin FinFETs, with each including a single semiconductor fin (20 or 40), although they can also be multi-fin FinFETs. For example, as shown in FIG. 6, each of p-type FinFETs PG-1 and PU-1 comprises two fins 14, which are denoted as 14-1 and 14-2, and each of p-type FinFETs PG-2 and PU-2 comprises two fins 34, which are denoted as 34-1 and 34-2. By adding more fins, the currents Ion of p-type FinFETs PG-1, PU-1, PG-2, and PU-2 are improved, and hence the speed of SRAM cell 10 is improved. Again, FIG. 6 includes SRAM cell 10 that includes a P-well region formed between two N-well regions N-well-1 and N-well-2.

FIG. 7 illustrates SRAM cell 10, wherein each of pull-up FinFETs PU-1 and PU-2 includes two fins 14-1 and 14-2. Pass-gate FinFETs PG-1 and PG-2, however, are single-fin FinFETs. Pull-down FinFETs PD-1 and PD-2 may be single-fin FinFETs, although they can also be multi-fin FinFETs. FIG. 8 illustrates an embodiment similar to the embodiment in FIG. 7, except that in FIG. 7, fin 34-1, which is closer to the P-well region, does not extend underlying gate electrode 38, and fin 34-2, which is closer to the P-well, extends underlying gate electrode 38. In FIG. 8, however, fin 34-1 extends underlying gate electrode 38, and fin 34-2 does not extend underlying gate electrode 38. Similarly, fins 14-1 and 14-2 in FIGS. 7 and 8 have similar arrangement as fins 34-1 and 34-2, respectively.

Figure 9:
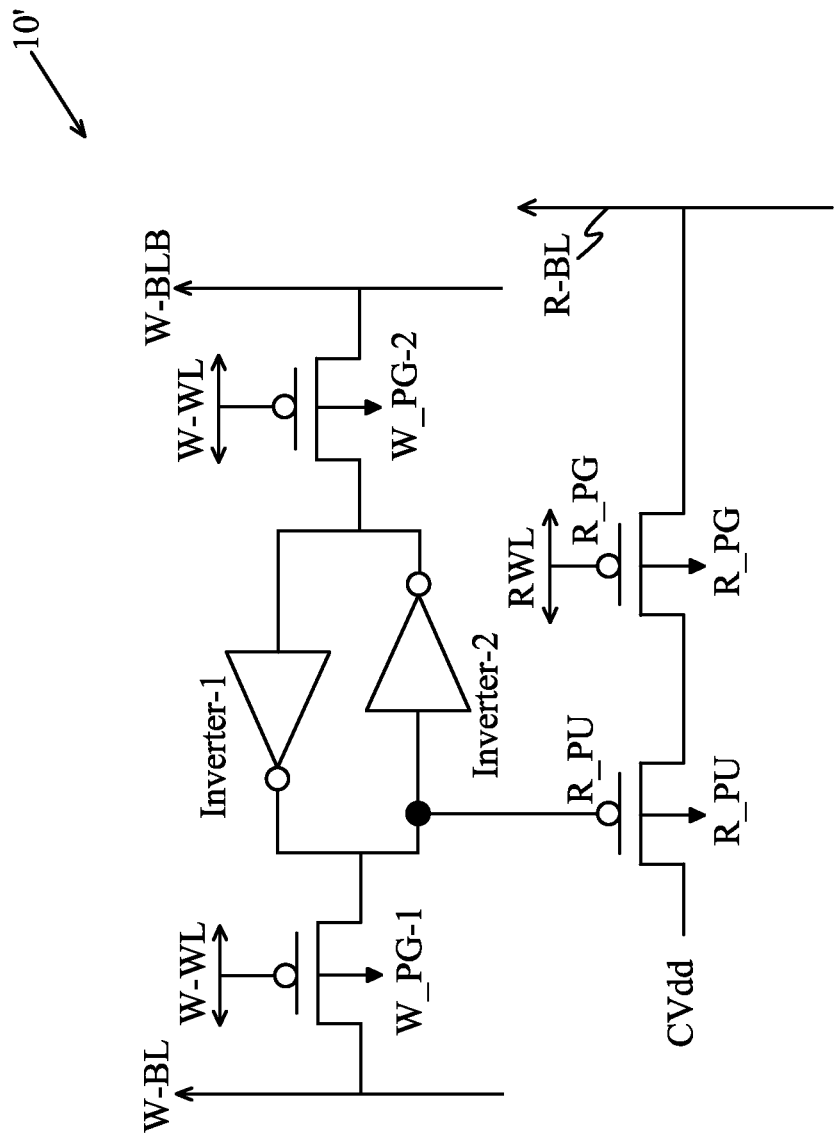
FIG. 9 is a circuit diagram of a two-port SRAM cell in accordance with exemplary embodiments.

FIG. 9 illustrates a circuit diagram of a two-port SRAM cell 10', which includes a write port and a read port. The write port includes inverters Inverter-1 and Inverter-2, which are essentially the same as the inverters Inverter-1 and Inverter-2 in FIG. 2, wherein inverter Inverter-1 includes FinFETs PU-1 and PD-1 in FIG. 1, and inverter Inverter-2 includes FinFETs PU-2 and PD-2 in FIG. 1. The write port further includes p-type pass-gate FinFETs W_PG-1 and W_PG-2, wherein the gates of FinFETs W_PG-1 and W_PG-2 are coupled to write word-line W-WL. The writing of SRAM cell 10' is through complementary write bit-lines W-BL and W-BLB. The read port includes inverters Inverter-1 and Inverter-2, pull-up transistor R_PU, and pass-gate transistor R_PG. Transistors R_PU and R_PG are p-type transistors, and may be FinFETs, which have the structure similar to what is shown in FIG. 3. The data read from SRAM cell is sent to read bit-line R-BL. Transistors R_PU is further coupled to positive power supply CVdd and either one of the inputs of inverters Inverter-1 and Inverter-2. Transistors R_PU and R_PG are cascaded. The gate of transistor R-PG may be coupled to read word-line WL.

Figure 10:
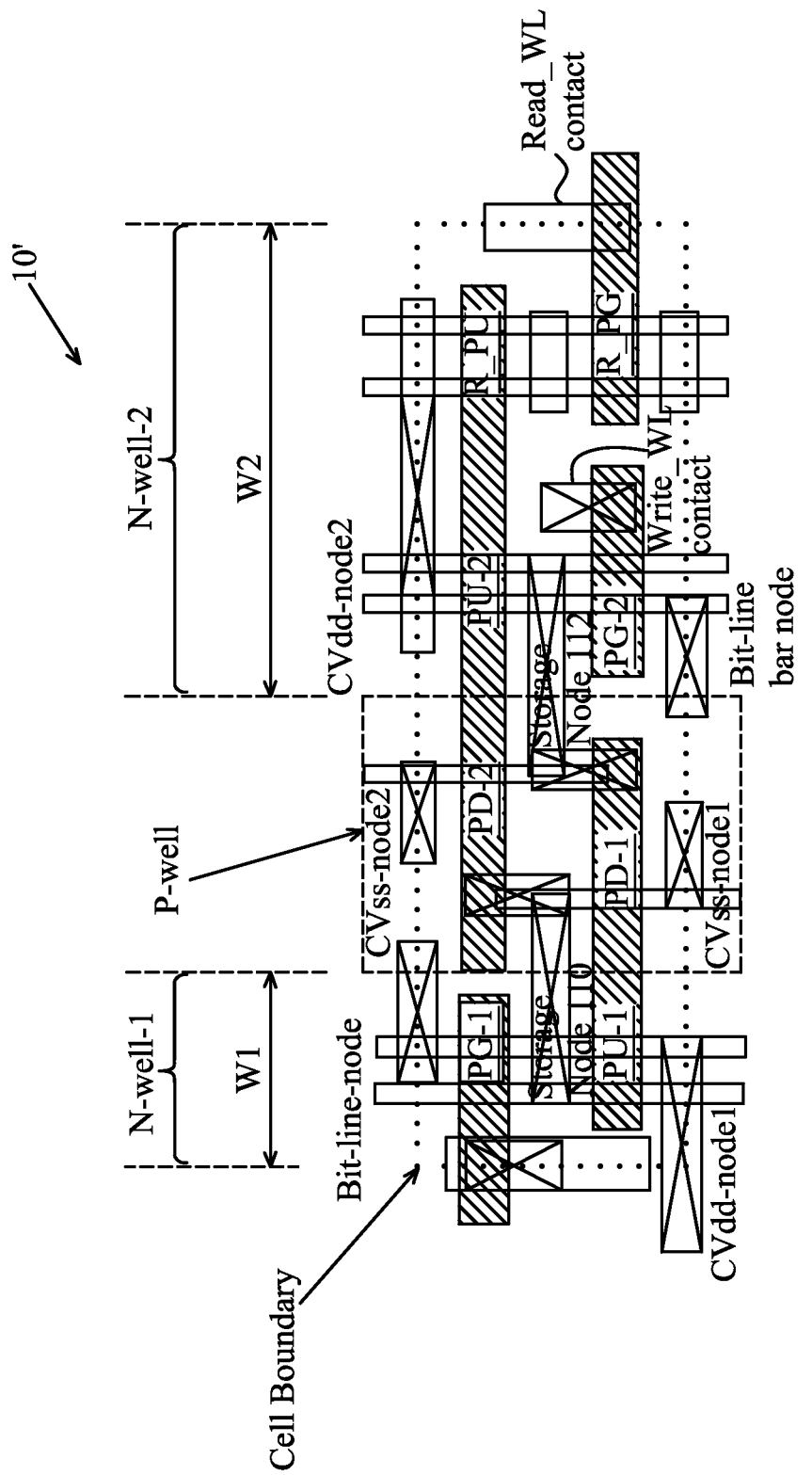
FIG. 10 illustrates a layout of the two-port SRAM cell in FIG. 9 in accordance with exemplary embodiments.

FIG. 10 illustrates an exemplary layout of the two-port SRAM cell 10', which includes a P-well region located between two N-well regions N-well-1 and N-well-2. P-type FinFETs R_PU and R_PG are disposed in N-well region N-well-2. Accordingly, width W2 of N-well region N-well-2 is greater than width W1 of N-well region N-well-1 in order to accommodate FinFETs R_PU and R_PG. It is realized that although transistors PG-1, PU-1, PG-2, PU-2, R_PU, and R_PG are illustrated as two-fin FinFETs, each of them may be a single-fin FinFET or may include more than two fins.

Figure 11:
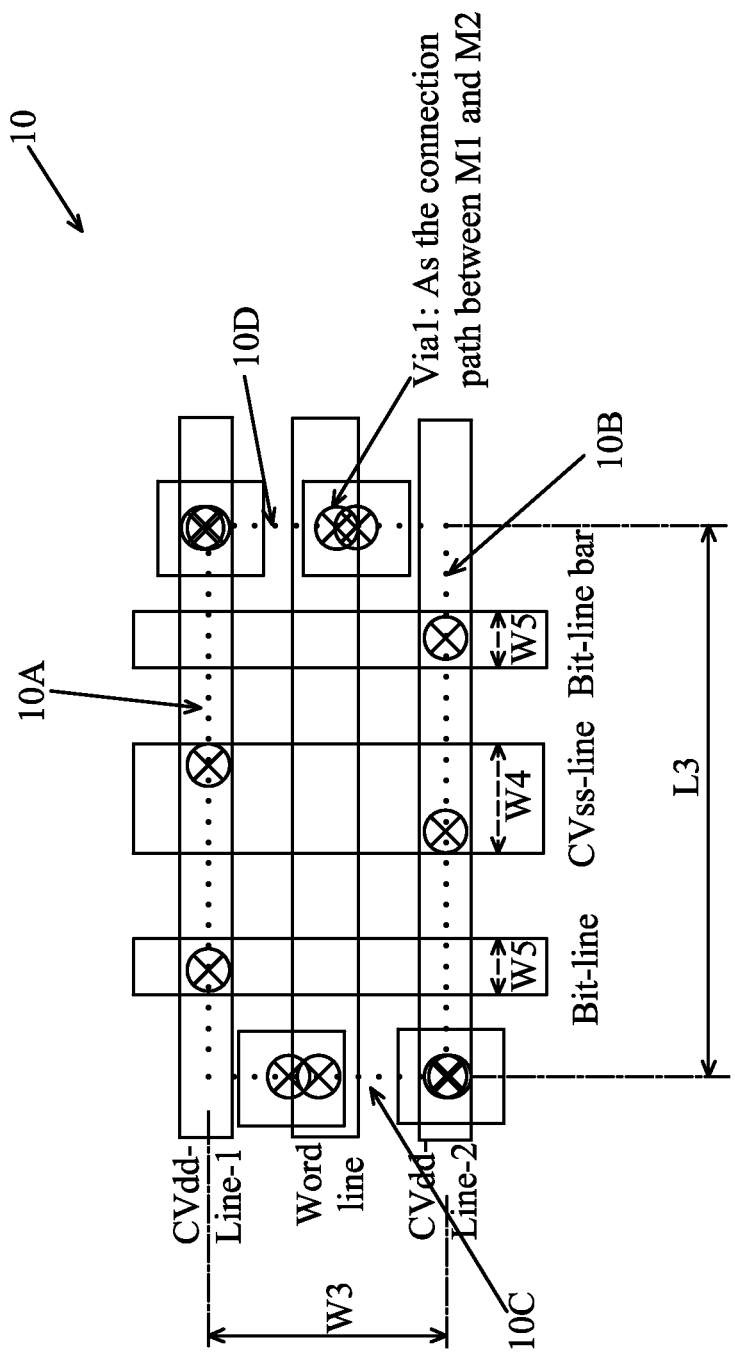
FIGS. 11-14 are layouts of power supply lines and signal lines of an SRAM cell in accordance with various embodiments.

FIGS. 11 through 21 illustrate circuit diagrams or layouts in accordance with alternative embodiments, which illustrate how power supply lines and signal lines of SRAM cells are laid out. Referring to FIG. 11, SRAM cell 10 includes boundaries 10A, 10B, 10C, and 10D, which cell boundaries form a rectangular shape. Cell boundaries 10A and 10B are opposite to each other, and are referred to as long cell boundaries. Cell boundaries 10C and 10D are opposite to each other, and are referred to as the short cell boundaries, which are shorter than long boundaries 10A and 10B.

In some embodiments, length L3 of SRAM cell 10 is greater than width W3 of SRAM cell 10, wherein length L3 is measured in the direction perpendicular to the lengthwise directions of the fins 14, 20, 34, and 40 (refer to FIG. 15), and parallel to the lengthwise directions of gate electrodes 16, 18, 36, and 38. Width W3 is measured in the direction perpendicular to the direction of length L3. Ratio L3/W3 may be greater than about 1.5, greater than about 2, greater than about 2.5, or greater than about 3. Accordingly, SRAM cell 10 is an elongated cell.

Metal line CVss-line, which carries voltage VSS for SRAM cell 10, is located in a same metal layer as metal lines Bit-line and Bit-line bar (also see FIG. 1). Metal lines Bit-line and Bit-line bar carry bit-line signals and bit-line bar signals, respectively. CVss-line may be located between metal lines Bit-line and Bit-line bar. In some embodiments, lines CVss-line, Bit-line, and Bit-line bar are in metal layer M1 (FIG. 4). Furthermore, width W4 of the CVss-line may be greater than width W5 of lines Bit-line and Bit-line bar, wherein ratio W4/W5 may be greater than about 1.5, or greater than about 2. Metal lines CVss-line, Bit-line, and Bit-line bar are perpendicular to, and cross over, the longer cell boundaries 10A and 10B. Accordingly, the length of the portion of CVs s-line within SRAM cell may be equal to W3.

Metal lines Word-line and metal lines CVdd-line-1 and CVdd-line-2 are parallel to each other and are in the same metal layer. Metal lines CVdd-line-1 and CVdd-line-2 carry power supply voltage Vdd. The word-line is between lines CVdd-line-1 and CVdd-line-2, which may overlap the opposite long boundaries of SRAM cell 10. The CVdd-line and lines CVdd-line-1 and CVdd-line-2 are perpendicular to, and cross over, the shorter cell boundaries 10C and 10D. The length of the portion of CVdd-line within SRAM cell may be equal to L3. In some embodiments, the word-line and lines Vdd-line-1 and CVdd-line-2 may be in metal layer M2 (FIG. 1). The vias between metal layer M1 and M2, and the vias connecting metal lines in metal layer M1 to the underlying contact plugs are illustrated using the symbol with a circle and an "x" sign in the circle.

In accordance with some embodiments, laying out CVss-line in the width direction of SRAM cell 10 provides more space for allocating the CVss-line since length L3 is greater than width W3. Accordingly, width W4 of CVs s-line may be increased. This provides a good grounding ability for SRAM cell 10 and the respective SRAM array.

Figure 12:
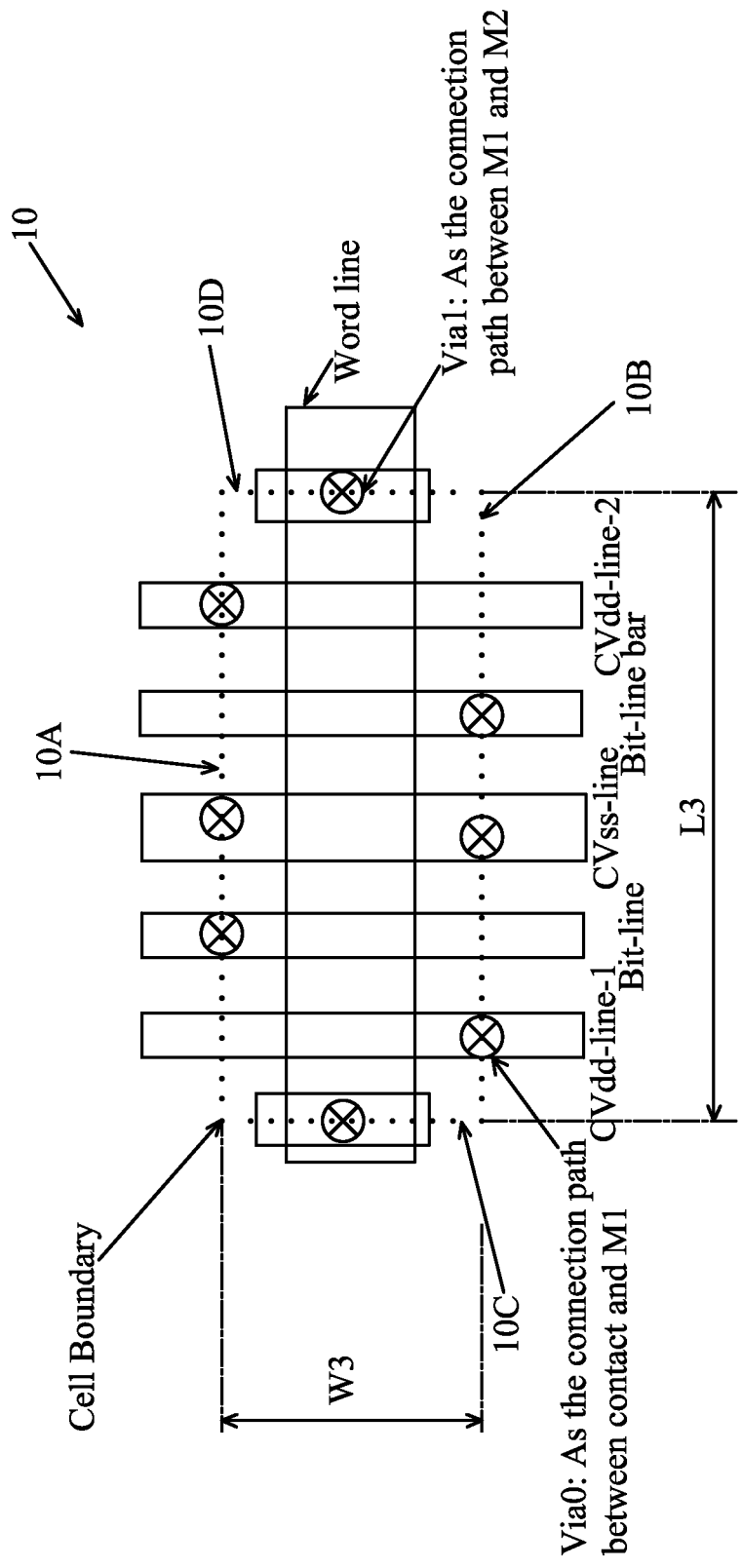

FIG. 12 illustrates a layout of the signal lines and the power supply lines of SRAM cell 10 in accordance with alternative embodiments. These embodiments are similar to the embodiments in FIG. 11, except that lines CVdd-line-1 and CVdd-line-2 are parallel to lines CVss-line, Bit-line, and Bit-line Bar. Furthermore, lines CVss-line, Bit-line, and Bit-line Bar may be allocated between lines CVdd-line-1 and CVdd-line-2. In these embodiments, lines CVss-line, Bit-line, Bit-line Bar, CVdd-line-1, and CVdd-line-2 are perpendicular to the long boundaries 10A and 10B, and hence there is a greater space for allocating these lines. Lines CVss-line, Bit-line, Bit-line Bar, CVdd-line-1, and CVdd-line-2 may be in metal layer M1 (FIG. 4) in accordance with some embodiments. The word-line may be perpendicular to the CVs s-line, and may be in metal layer M2 (FIG. 4) in accordance with some embodiments.

Figure 13:
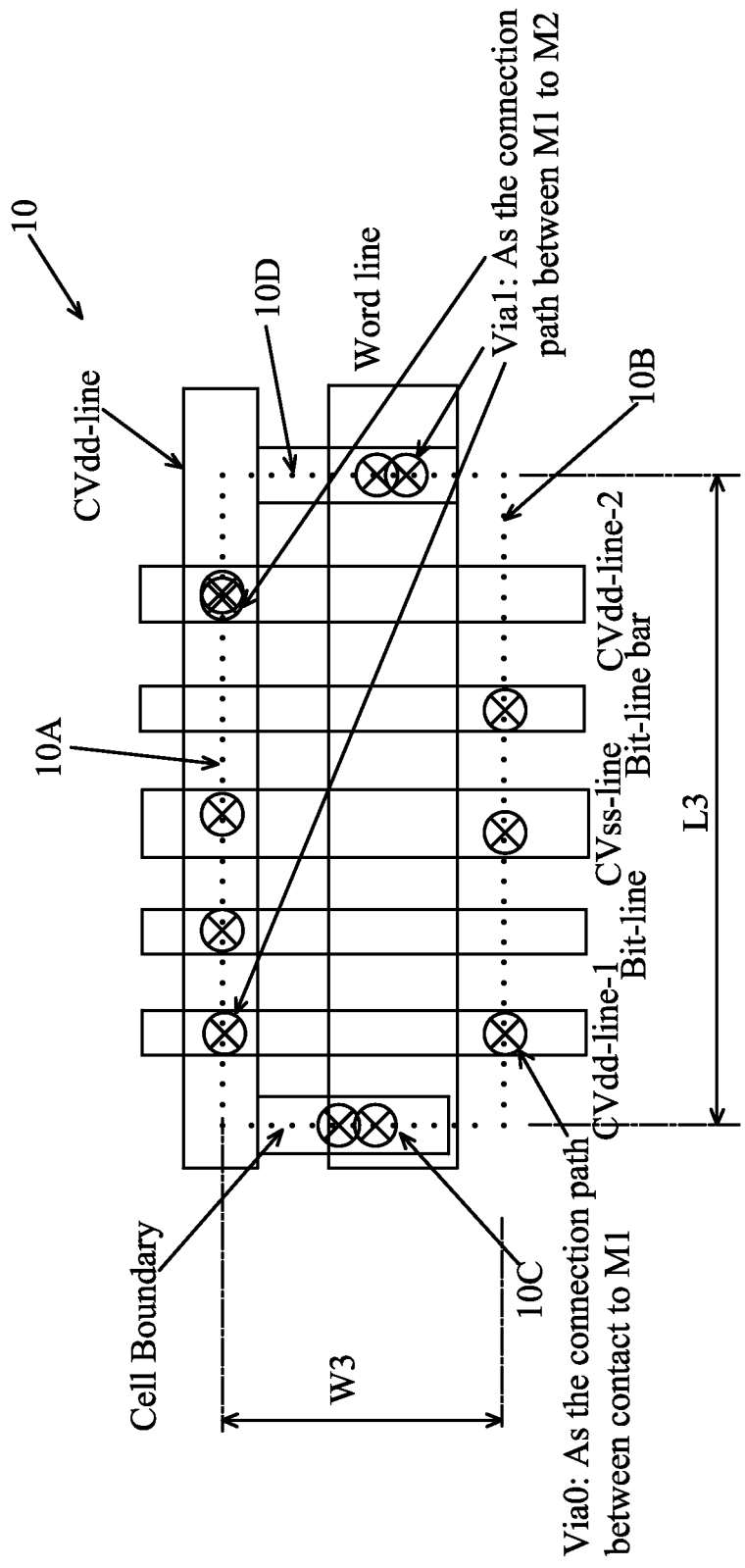

FIG. 13 illustrates a layout of the signal lines and power supply lines of SRAM cell 10 in accordance with alternative embodiments. These embodiments are similar to the embodiments in FIG. 12, except that there is an additional CVdd-line in metal layer M2 (FIG. 4). The additional CVdd-line may overlap (and may be parallel to) long boundary 10A. The CVdd-line in metal layer M2 may form a power mesh with metal lines CVdd-line-1 and CVdd-line-2, which may be in metal layer M1.

Figure 14:
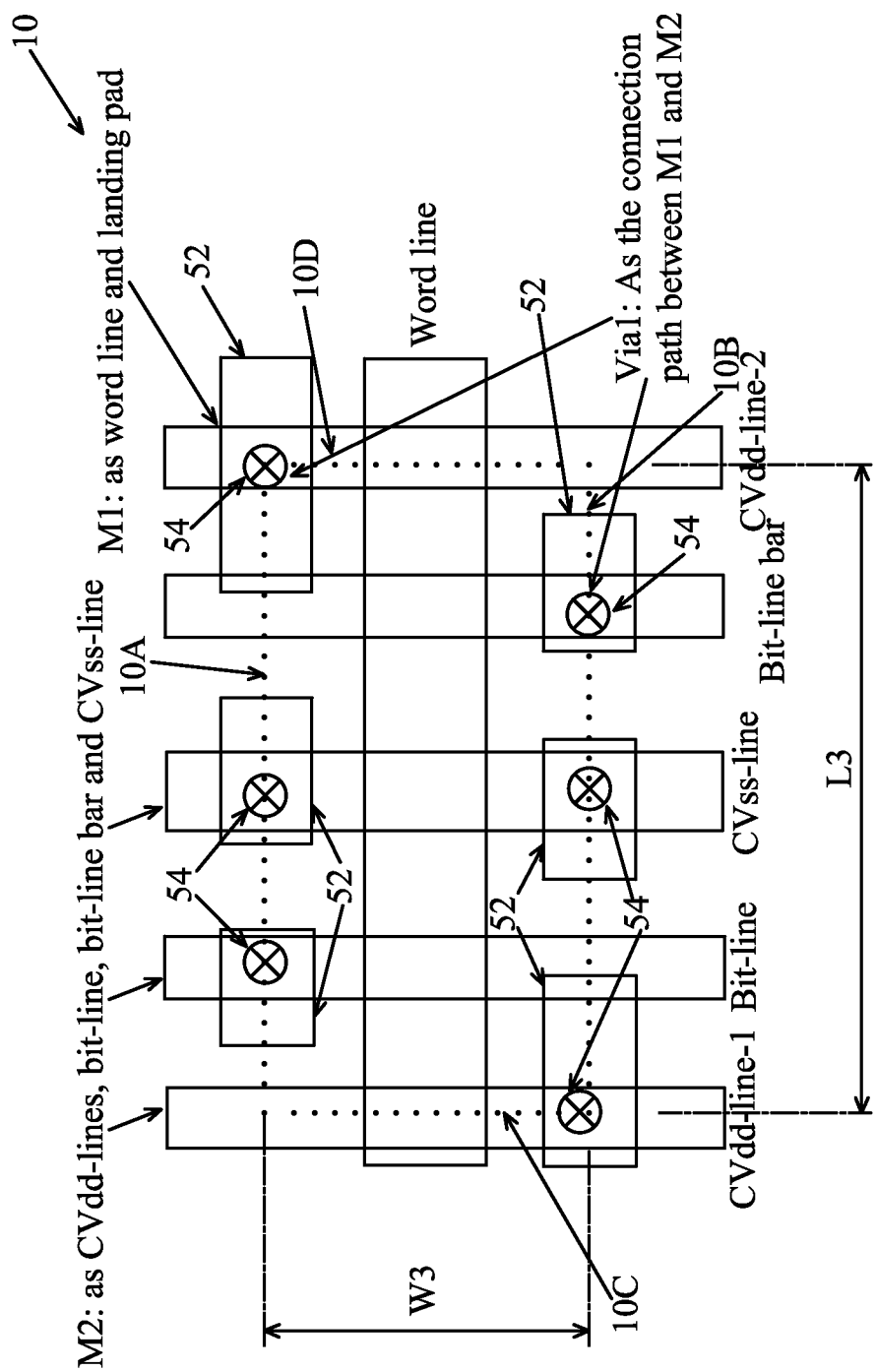

FIG. 14 illustrates a layout of the signal lines and the power supply lines of SRAM cell 10 in accordance with alternative embodiments. In these embodiments, lines CVss-line, Bit-line, Bit-line Bar, CVdd-line-1, and CVdd-line-2 may be in metal layer M2 (FIG. 4). Landing pads 52 are formed in metal layer M1, and are connected to the respective overlying lines CVs s-line, Bit-line, Bit-line Bar, CVdd-line-1, and CVdd-line-2 through vias 54. Again, lines CVss-line, Bit-line, Bit-line Bar, CVdd-line-1, and CVdd-line-2 are perpendicular to the long boundaries 10A and 10B.

Figure 15:
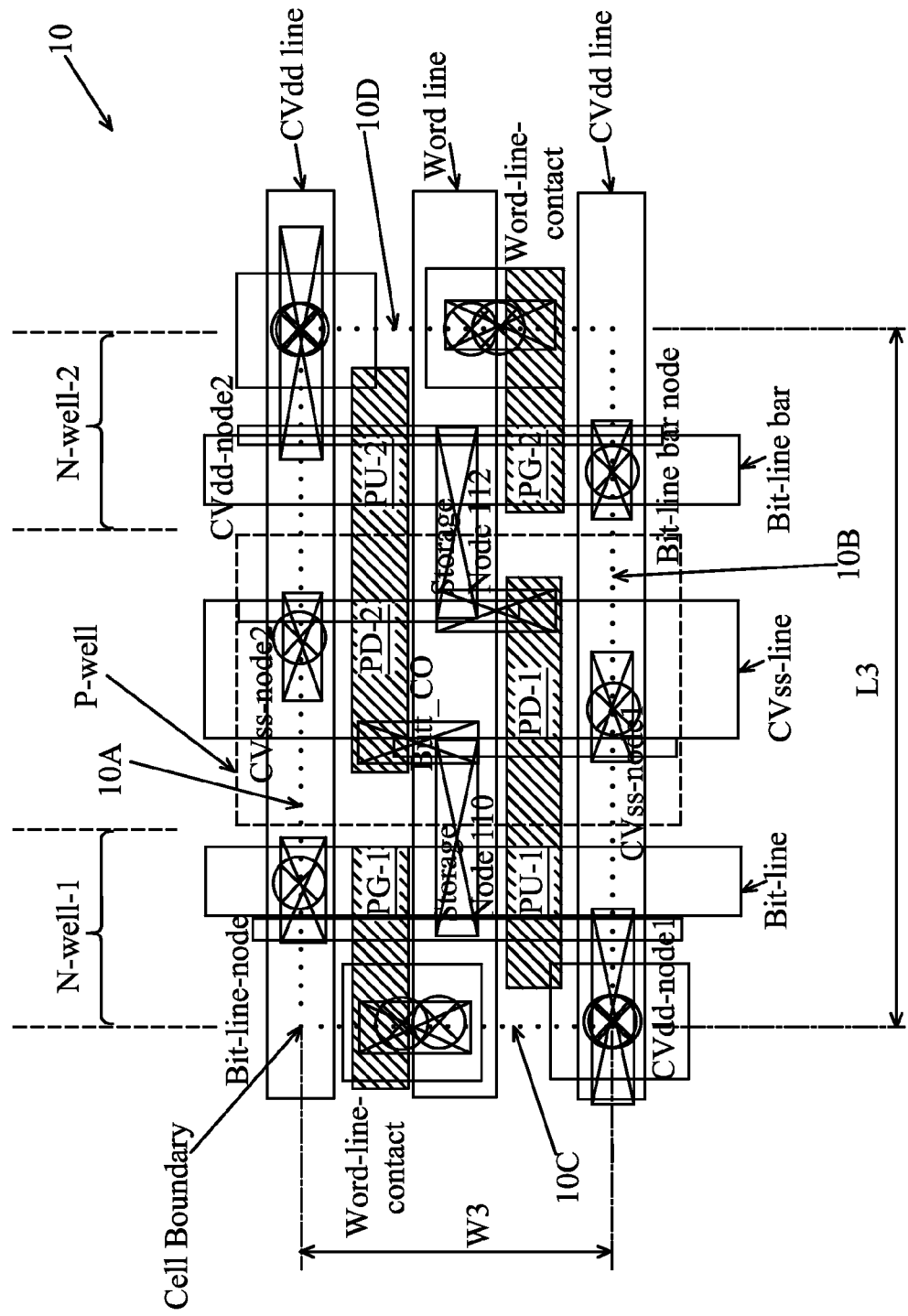
FIGS. 15-18 are layouts of SRAM cells in accordance with various embodiments, wherein the layouts of FinFET, the power supply lines, and the signal lines are combined.

FIG. 15 illustrates a combined layout including the layout of FinFETs in FIG. 5 and the layout of the signal lines and the power supply lines in FIG. 11. The combined layout illustrates the relationship between the FinFETs and the signal lines and power supply lines. The details regarding the layouts have been discussed referring to FIGS. 5 and 11, and hence are not repeated herein. Since the Bit-line and Bit-line Bar are connected to the source/drain regions of pass-gate FinFETs PG-1 and PG-2, respectively, the Bit-line and Bit-line Bar are allocated to overlap N-well regions N-well-1 and N-well-2, respectively. It is illustrated that, as shown in FIG. 1, the sources of pull-down FinFETs PD-1 and PD-2 are connected to power supply voltage Vss. Accordingly, by allocating CVss-line overlapping the P-well region, it is easy to provide power supply voltage Vss to the source regions of pull-down FinFETs PD-1 and PD-2.

Figure 16:
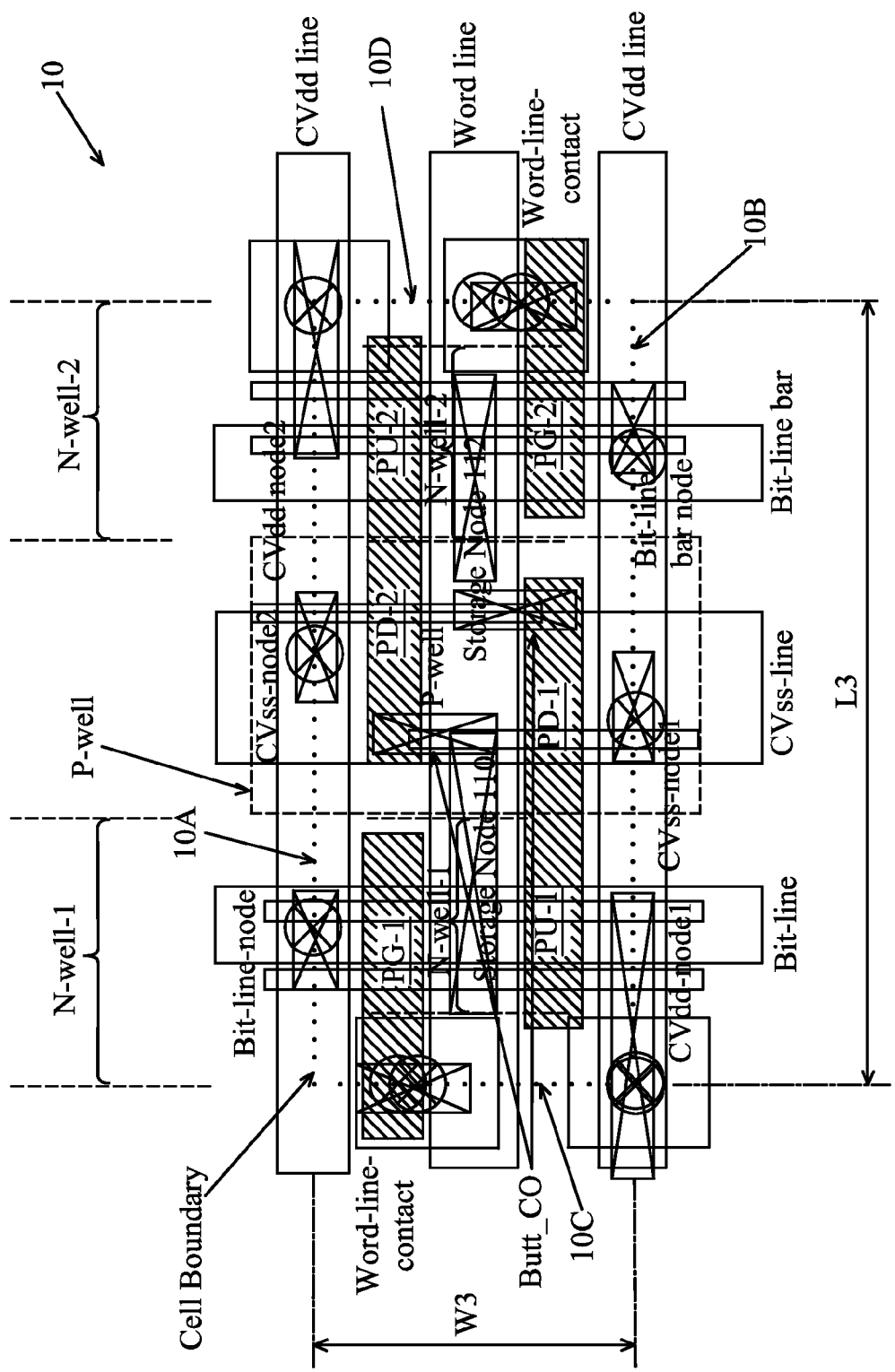
Figure 17:
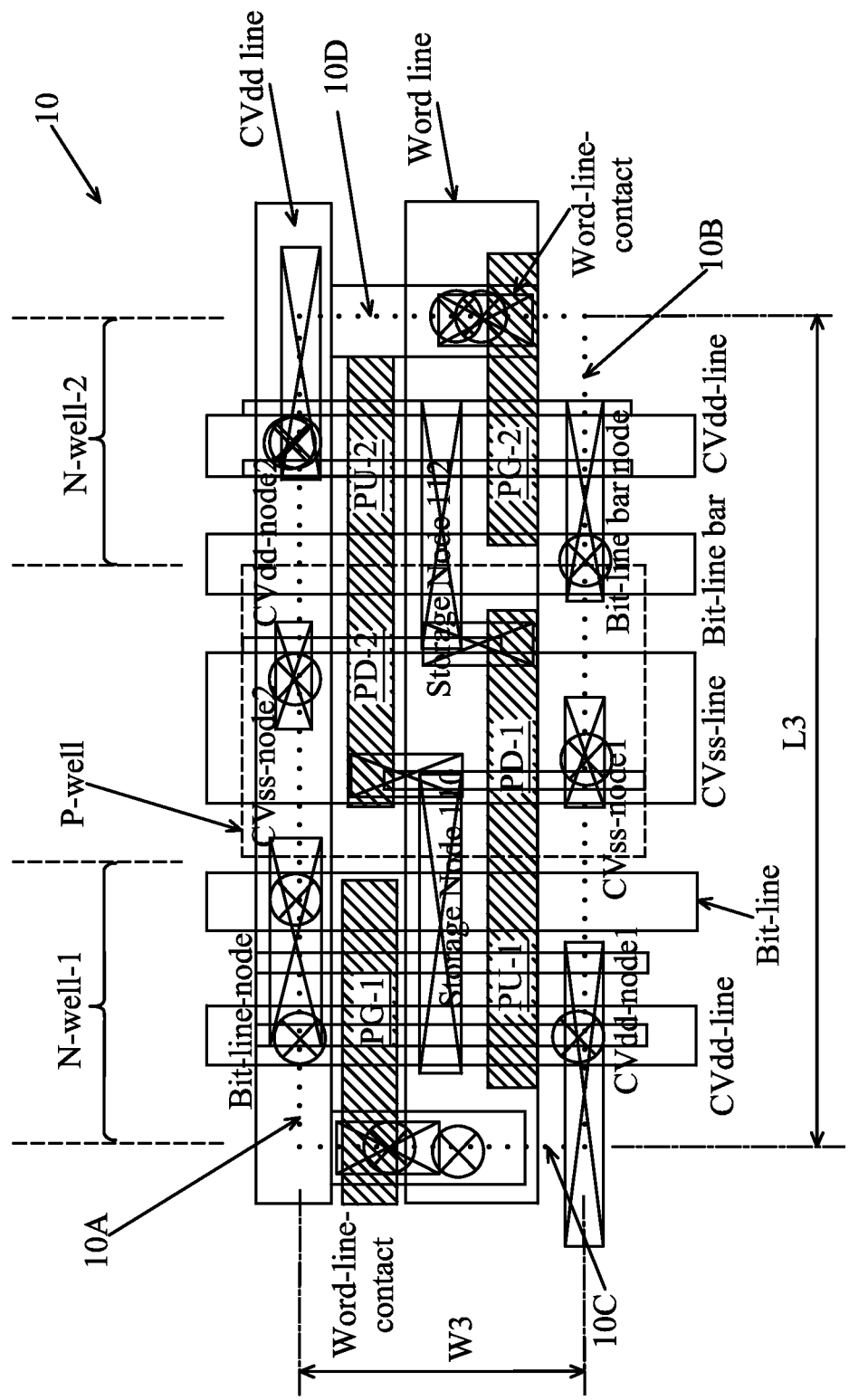

Similarly, FIG. 16 illustrates a combined layout including the layout of FinFETs in FIG. 6 and the layout of the signal lines and the power supply lines in FIG. 11. FIG. 17 illustrates a combined layout including the layout of FinFETs in FIG. 6 and the layout of the signal lines and the power supply lines in FIG. 13. It is appreciated that FIGS. 15 through 17 merely provide several examples as how the layouts in FIGS. 5 through 8 may be combined with the layout in FIGS. 11 through 14. In accordance with other embodiments, any of the layouts in FIGS. 5 through 8 may be combined with any of the layouts scheme in FIGS. 11 through 14.

Figure 18:
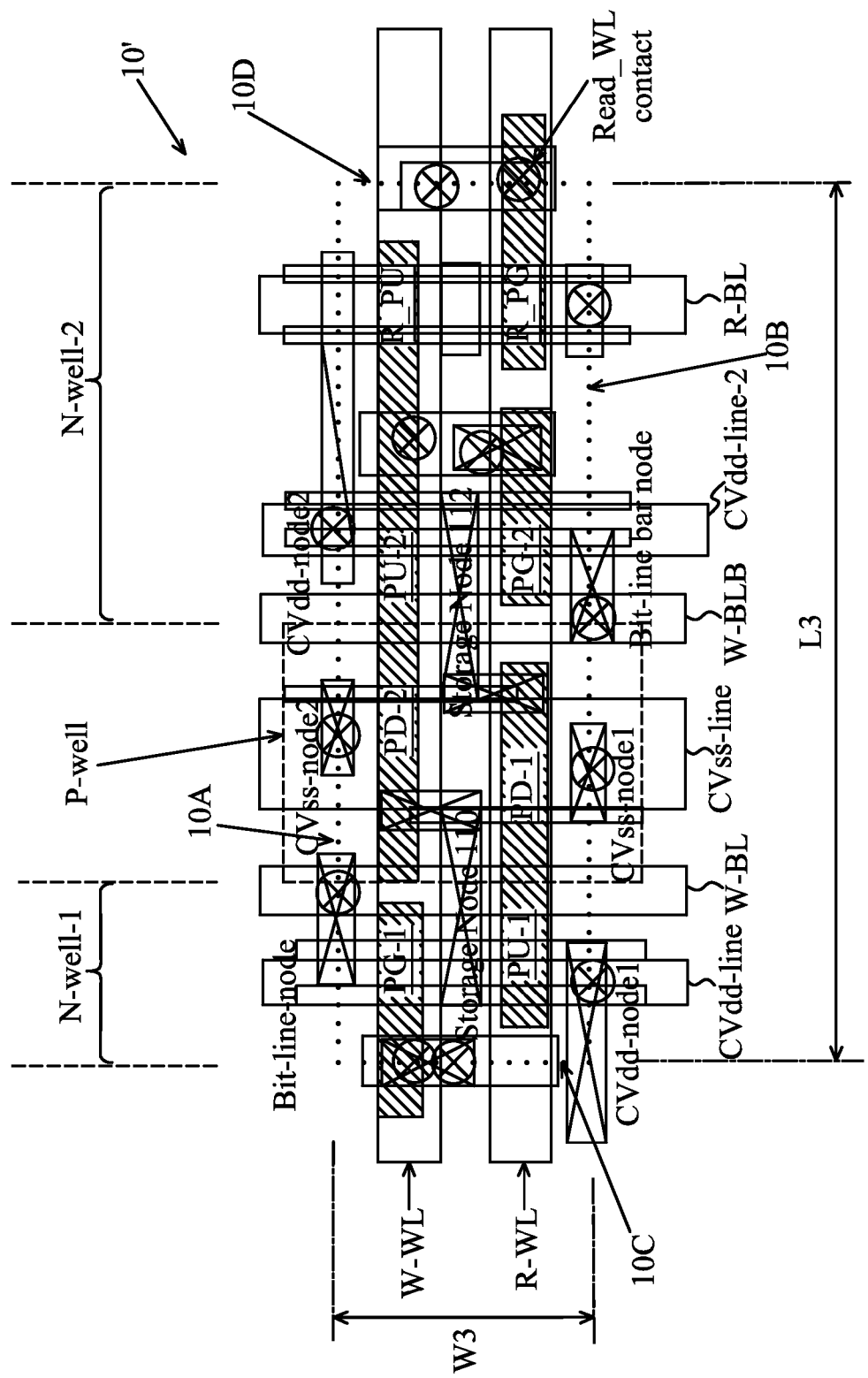

FIG. 18 illustrates a layout including the two-port SRAM cell 10' in FIG. 10 and the respective layout of the signal lines and power supply lines. In accordance with some embodiments, lines CVss-line, W-BL, W-BLB, CVdd-line-1, and CVdd-line-2 are in metal layer M1 (FIG. 4), and are perpendicular to the long boundaries 10A and 10B of SRAM cell 10'. The write word-line W-WL and the read word-line R-WL may be allocated in metal layer M2 (also see FIG. 4) and parallel to long boundaries 10A and 10B.

Figure 19:
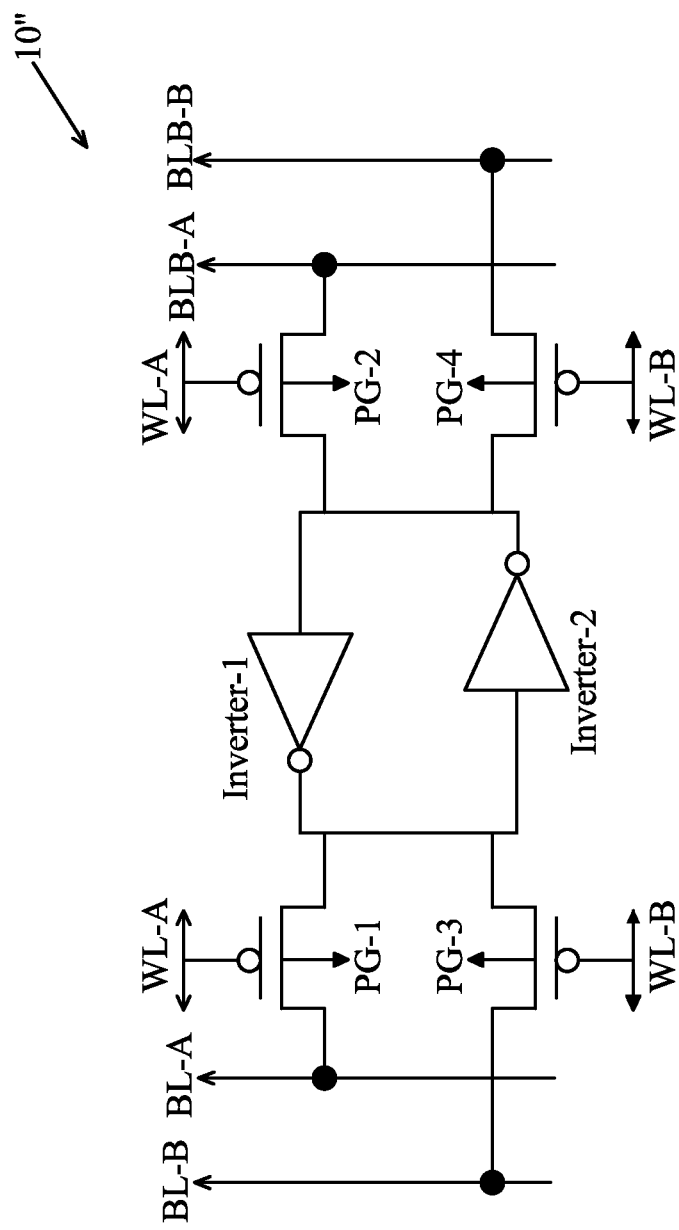
FIG. 19 is a circuit diagram of a dual-port SRAM cell in accordance with exemplary embodiments.

FIG. 19 illustrates a circuit diagram of a dual-port SRAM cell 10", which includes port A and port B, each may be configured as a read port or a write port. Port A includes inverters Inverter-1 and Inverter-2, which are essentially the same as the inverters Inverter-1 and Inverter-2 in FIG. 2. Port A further includes p-type pass-gate FinFETs PG-1 and PG-2, wherein the gates of FinFETs PG-1 and PG-2 are coupled to word-line WL-A. FinFETs PG-1 and PG-2 are further coupled to complementary bit-lines BL-A and BLB-A, respectively. Port B includes inverters Inverter-1 and Inverter-2, and p-type pass-gate FinFETs PG-3 and PG-4, wherein the gates of FinFETs PG-3 and PG-4 are coupled to word-line WL-B. FinFETs PG-3 and PG-4 are further coupled to complementary bit-lines BL-B and BLB-B, respectively. The layout of dual-port SRAM cell 10" may be found with reference to the layout in FIGS. 5-8, with all pull-down FinFETs in the p-well region, and all pull-up FinFETs and pass-gate FinFETs in the first and the n-well regions N-well-1 and N-well-2.

Figure 20:
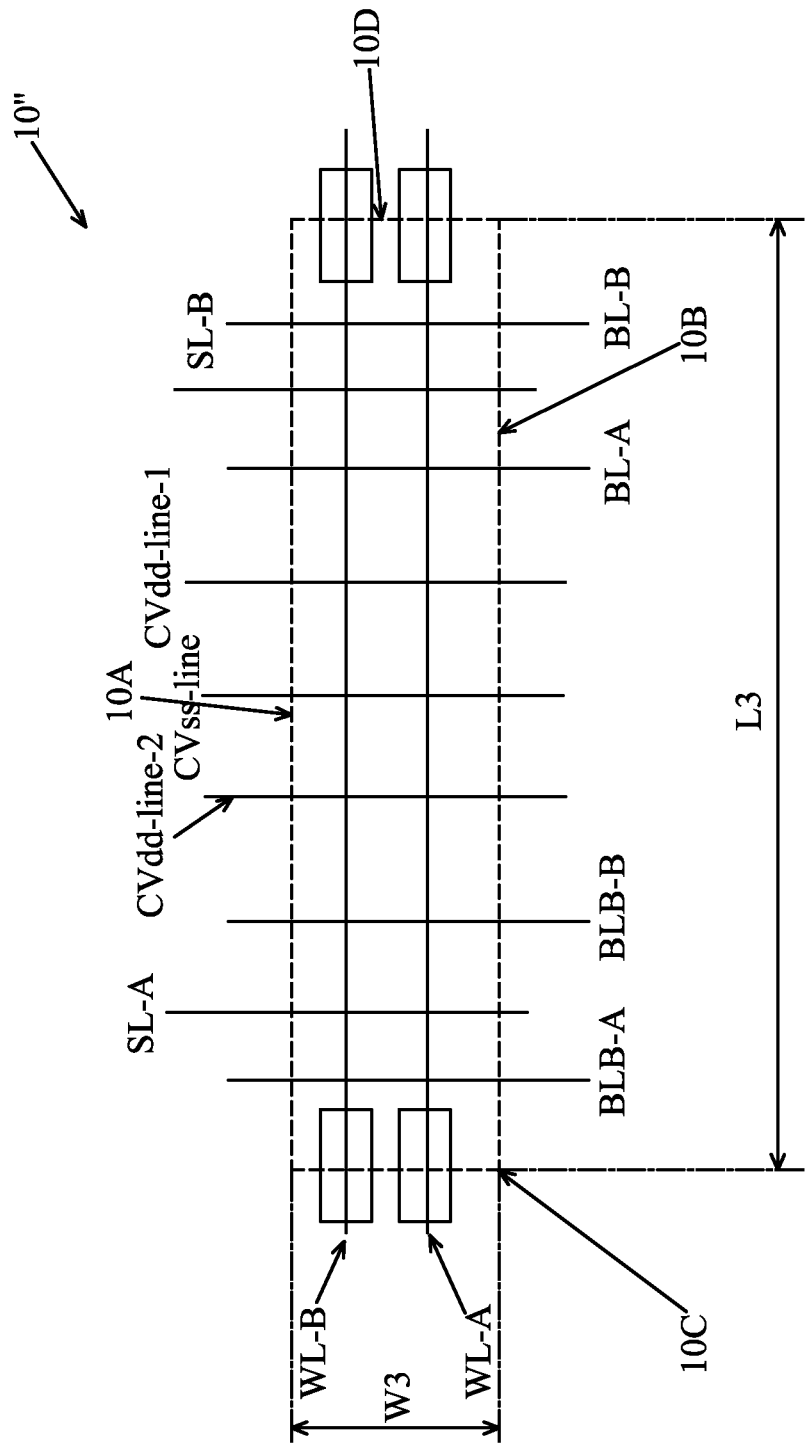
FIGS. 20 and 21 illustrate layouts of the dual-port SRAM cell in accordance with exemplary embodiments.
Figure 21:
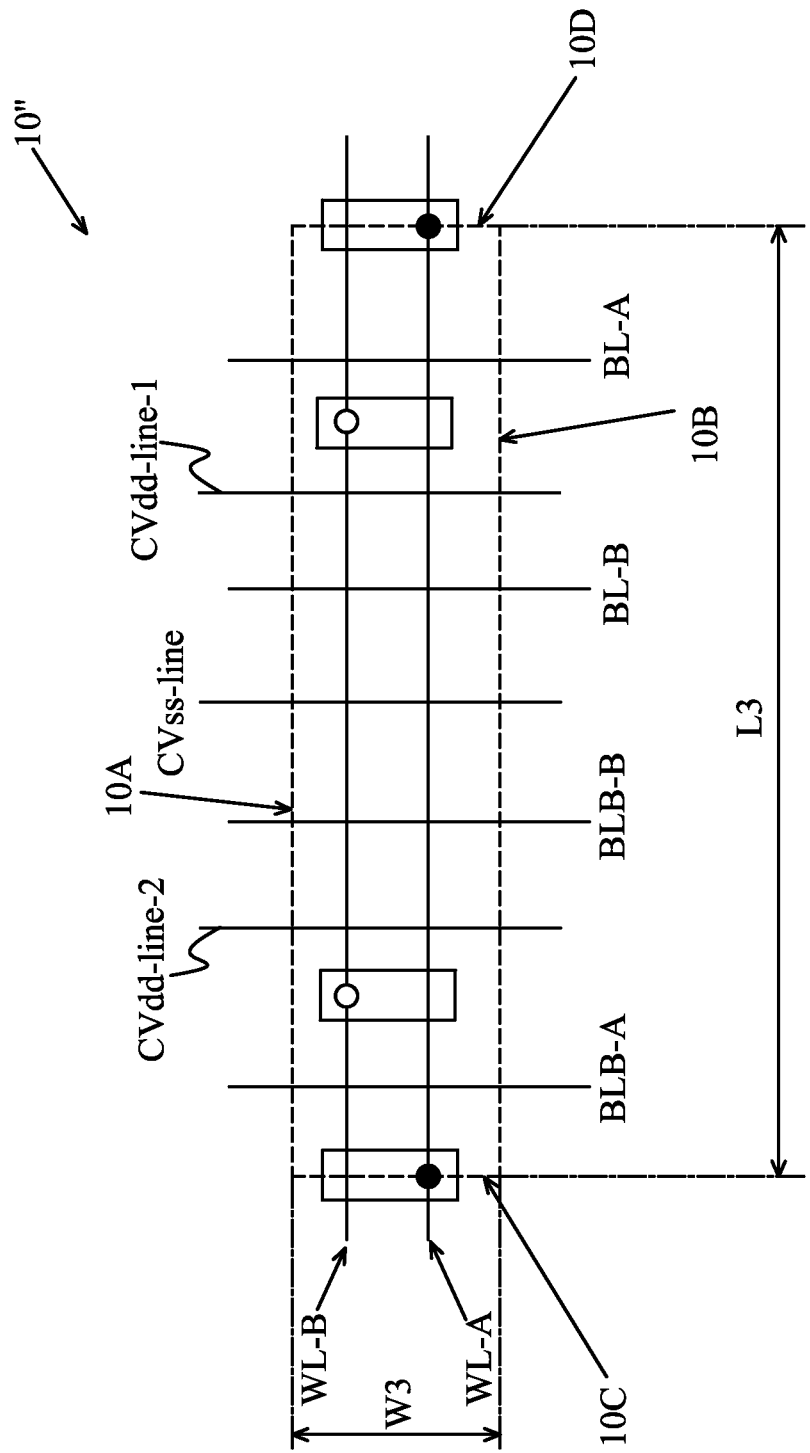

FIGS. 20 and 21 illustrate the layouts of the metal lines in dual-port SRAM cell 10" in accordance with exemplary embodiments. In accordance with these embodiments, as shown in FIG. 20, line CVss-line is located between line CVdd-line-1 and CVdd-line-2. Bit-lines BL-B, BLB-B, BLB-A, and BL-A and are disposed on the outer sides of lines CVs s-line, BL-B, and BLB-B. In some embodiments, lines CVss-line, CVdd-line-1, and CVdd-line-2, and bit-lines BLB-A, BLB-B, BL-A, and BL-B are in metal layer M1 (FIG. 4). Word-lines WL-A and WL-B may be allocated in metal layer M2 (FIG. 4) in accordance with some embodiments. Shielding lines SL-A and SL-B may also be allocated to be parallel to CVss-line, and may be connected to a constant voltage, such as VDD or VSS. Shielding lines SL-A and SL-B may also be in metal layer M1.

The layout in FIG. 21 is similar to the layout in FIG. 20, except that shielding lines SL-A and SL-B are not formed, and line CVdd-line-2 is disposed between bit-lines BLB-A and BLB-B, and line CVdd-line-1 is disposed between bit-lines BL-A and BL-B. Although not shown in FIGS. 20 and 21, the layout of SRAM cell 10" may also include a P-well region between two N-well regions, similar to FIG. 5, for example.

The SRAM cells in accordance with the embodiments of the present disclosure may be written into or read from using modified voltages that are different from the Vdd and Vss voltages. The modified voltages may be applied on word-lines, bit-lines, CVss-lines, CVdd-lines, and the like. Tables 1 through 4 illustrate some exemplary voltages for read and write operations and the standby mode of an SRAM array. In Tables 1 through 4, the operations that may be performed on SRAM cells and the exemplary voltages applied on the respective voltage lines are listed. The voltage lines listed in Tables 1 through 4 include power lines (CVdd-line and CVss-line) and signal/control lines (Bit-line, Bit-line Bar, and Word-line) that are connected to an SRAM array, wherein the SRAM array is schematically illustrated in FIGS. 22-25.

The operations shown in Table 1 through 3 include write data "1," write data "0," and "read data out." The operation "Write data '1'" means writing a logic high data ("1") into the respective SRAM cell, and the operation "Write data '0'" means writing a logic low data ("0") into the respective SRAM cell. The symbol "Vdd(1)" means applying a voltage equal to positive power supply voltage Vdd to the respective voltage line. The symbol "Vss(0)" means applying a voltage equal to power supply voltage Vss to the respective voltage line. Throughout the description, the voltages that are applied with either Vdd(1) or Vss(0) are not discussed in detail, and the respective voltages may be found referring to Tables 1 through 4.

Table 1 lists the operations that may be performed on a single-port SRAM cell, and the exemplary voltages applied on the voltage lines that are connected to the single-port SRAM cell. An exemplary circuit diagram of the single-port SRAM cell is shown in FIG. 1. The exemplary layout and the voltage lines of the single-port SRAM cell are illustrated in FIGS. 11-17. The voltage lines shown in Table 1 correspond to the voltage lines that have similar names in FIGS. 11-17, except the "CVdd-line" in Table 1 corresponds to voltage lines "CVdd-line-1" and "CVdd-line-2" in FIGS. 11-17, which means that if CVdd-line in Table 1 has value "Vdd(1)," for example, then both CVdd-line-1 and CVdd-line-2 in FIGS. 11-17 are applied with voltage Vdd.

TABLE 1

| Single-Port Cell Operation | | Bit-line | Bit-line Bar | Word-line | CVss-line | CVdd-line |
|---|---|---|---|---|---|---|
| Write operation 1 | Write data "1" | Vdd(1) | Vss(0) | Vss(0) | Vss + $\Delta$V1 | Vdd(1) |
| | Write data "0" | Vss(0) | Vdd(1) | Vss(0) | Vss + $\Delta$V1 | Vdd(1) |
| Write operation 2 | Write data "1" | Vdd + $\Delta$V2 | Vss(0) | Vss(0) | Vss(0) | Vdd(1) |
| | Write data "0" | Vss(0) | Vdd + $\Delta$V2 | Vss(0) | Vss(0) | Vdd(1) |
| Read operation 1 | Read data out | Vss(0) | Vss(0) | Vss + $\Delta$V3 | Vss(0) | Vdd(1) |
| Read operation 2 | Read data out | Vss(0) | Vss(0) | Vss(0) | Vss − $\Delta$V4 | Vdd(1) |

Table 1 illustrates write operation 1 and write operation 2, which are different approaches for performing write operations. As shown in Table 1, in write operation 1 for writing data "1" or data "0" into an SRAM cell, the respective CVss-line is applied with a voltage equal to Vss+ΔV1, which is a voltage higher than power supply voltage Vss (for example, en electrical ground voltage), and lower than power supply voltage Vdd. In some embodiments, voltage difference ΔV1 is greater than about 30 mV, although it may have a different value. The remaining voltages applied on other voltage lines as shown in Table 1 may be regular Vdd(1) voltage or Vss(0) voltage.

In write operation 2 for writing data "1" into an SRAM cell, the respective Bit-line is applied with a voltage equal to Vdd+ΔV2, which is a voltage higher than power supply voltage Vdd. The respective Bit-line Bar is applied with a voltage equal to Vss. In some embodiments, voltage difference ΔV2 is greater than about 30 mV, although it may have a different value. The remaining voltages applied on other voltage lines may be regular Vdd(1) voltage or Vss(0) voltage. In write operation 2 for writing data "0" into the SRAM cell, the respective Bit-line Bar is applied with a voltage equal to Vdd+ΔV2. The respective Bit-line is applied with a voltage equal to Vss. The remaining voltages applied on other voltage lines may be regular Vdd(1) voltage or Vss(0) voltage.

In the write operations 1 and 2 for writing into the sing-port SRAM cell, by increase the voltages on the CVss-line, Bit-line, or Bit-line Bar, the write margin may be improved, and hence the write speed and reliability are improved.

Table 1 also illustrates read operation 1 and read operation 2, which are different approaches for performing read operations. In read operation 1 for reading data out of an SRAM cell, the respective Word-line is applied with a voltage equal to Vss+ΔV3, which is a voltage higher than power supply voltage Vss, and lower than power supply voltage Vdd. In some embodiments, voltage difference ΔV3 is greater than about 30 mV, although it may have a different value. The remaining voltages applied on other voltage lines in read operation 1 may be regular Vdd(1) voltage or Vss(0) voltage.

In read operation 2 for reading data out of an SRAM cell, the respective CVss-line is applied with a voltage equal to Vss−ΔV4, which is a voltage lower than power supply voltage Vss (for example, en electrical ground voltage). Voltage Vss−ΔV4 may also be a negative voltage. In some embodiments, voltage difference ΔV4 is greater than about 30 mV, although it may have a different value. The remaining voltages applied on other voltage lines in read operation 2 may be regular Vdd(1) voltage or Vss(0) voltage. With either the increased word-line voltage in read operation 1, or the decreased CVss-line voltage in read operation 2, not only reading data from the SRAM cell is easier, the data stored in the DRAM cell is less unlikely to be flipped by the read operation.

Table 2 lists the operations that may be performed on two-port SRAM cells and dual port SRAM cells, and the exemplary voltages applied on the voltage lines that are connected to the two-port or dual-port SRAM cells. An exemplary circuit diagram of the two-port SRAM cell is shown in FIG. 9. The exemplary layout and the voltage lines of the two-port SRAM cell are illustrated in FIG. 18. The voltages applied on voltage lines R-BL and R-WL are not discussed herein, and hence are not shown in Table 2. When the SRAM cell is a two-port SRAM cell, the "Bit-line," "Bit-line bar," and "Write Word-line" in Table 4 correspond to "W-BL," "W-BLB," and "W-WL," respectively, in FIG. 18. The "CVss-line" in Table 2 corresponds to voltage line "CVss-line" in FIG. 18. The "CVdd-line" in Table 2 corresponds to voltage lines "CVdd-line-1" and "CVdd-line-2" in FIG. 18. Therefore, the subsequent discussion of Table 2 may be understood referring to these correspondences when the SRAM cell is a two-port SRAM cell.

An exemplary circuit diagram of the dual-port SRAM cell is shown in FIG. 19. The exemplary layout and the voltage lines of the dual-port SRAM cell are illustrated in FIGS. 20 and 21. When the SRAM cell is a dual-port SRAM cell, the complementary bit-line pair "Bit-line" and "Bit-line Bar" in Table 2 correspond to both the bit-line pair including "BL-A" and "BLB-A" and the bit-line pair including "BL-B" and "BLB-B" in FIGS. 20 and 21, depending on which pair is being used. The "Write Word-line" in Table 2 corresponds to both "WL-A" and "WL-B" in FIGS. 20 and 21. The "CVss-line" in Table 2 corresponds to voltage line "CVss-line" in FIGS. 20 and 21. The "CVdd-line" in Table 2 corresponds to voltage lines "CVdd-line-1" and "CVdd-line-2" in FIGS. 20 and 21. Therefore, the subsequent discussion of Table 2 may also be understood referring to these correspondences when the SRAM cell is a dual-port SRAM cell.

TABLE 2

| Two-Port or Dual-Port Cell Operation | | Bit-line | Bit-line Bar | Write Word-line | CVss-line | CVdd-line |
|---|---|---|---|---|---|---|
| Write Operation | Write data "1" | Vdd + ΔV2 | Vss(0) | Vss(0) | Vss(0) | Vdd(1) |
|  | Write data "0" | Vss(0) | Vdd + ΔV2 | Vss(0) | Vss(0) | Vdd(1) |
| Read Operation | Read data out | Vss(0) | Vss(0) | Vss + ΔV3 | Vss(0) | Vdd(1) |

As shown in Table 2, in a write operation for writing data "1" into a two-port or dual-port SRAM cell, the respective Bit-line in Table 2 is applied with a voltage equal to Vdd+ΔV2, which is a voltage higher than power supply voltage Vdd. The respective Bit-line Bar is applied with a voltage equal to Vss. In some embodiments, voltage difference ΔV2 is greater than about 30 mV, although it may have a different value. The remaining voltages applied on other voltage lines in the write operation may be regular Vdd(1) voltage or Vss(0) voltage. When writing data "0" into the two-port or dual-port SRAM cell, the respective Bit-line Bar is applied with a voltage equal to Vdd+ΔV2. The respective Bit-line is applied with a voltage equal to Vss. The remaining voltages applied on other voltage lines as shown in Table 2 may be regular Vdd(1) voltage or Vss(0) voltage.

In a read operation for reading data out of the dual-port or two-port SRAM cell, the respective Write Word-line is applied with a voltage equal to Vss+ΔV3, which is a voltage high than power supply voltage Vss. In some embodiments, voltage difference ΔV3 is greater than about 30 mV, although it may have a different value. The remaining voltages applied on other voltage lines in the read operation may be regular Vdd(1) voltage or Vss(0) voltage.

In the operations shown in Table 2, when data is written into some SRAM cells that are connected to a word line, the remaining SRAM cells connected to the same word line experience dummy read. With the increased voltages on the Bit-line and Bit-Line bar, the data in the SRAM cells experiencing dummy read are protected from being changed by the dummy read operation.

Table 3 lists the operations that may be performed on two-port SRAM cells, and the exemplary voltages applied on the voltage lines that are connected to the two-port SRAM cells. The respective operations are performed so that all SRAM cells connected to a same word-line are written into or read from at the same time. Therefore, no dummy read occurs to any of the SRAM cells. An exemplary circuit diagram of the two-port SRAM cell is shown in FIG. 9. The exemplary layout and the voltage lines of the two-port SRAM cell are illustrated in FIG. 18. The voltage line correspondence between Table 3 and FIG. 18 is the same as described for Table 2, except that "Write/Read Word-line" in Table 3 corresponds to word-line W-WL (in write operations) or word-line R-WL (in read-operations) in FIG. 18. Therefore, Table 2 and FIG. 18 may be understood referring to these correspondences.

TABLE 3

| Two-Port Operation | | Bit-line | Bit-line Bar | Write/Read Word-line | CVss-line | CVdd-line |
|---|---|---|---|---|---|---|
| Write Operation | Write data "1" | Vdd(1) | Vss(0) | Vss − ΔV5 | Vss(0) | Vdd(1) |
| | Write data "0" | Vss(0) | Vdd(1) | Vss − ΔV5 | Vss(0) | Vdd(1) |
| Read Operation | Read data out | Vss(0) | Vss(0) | Vss − ΔV5 | Vss(0) | Vdd(1) |

As shown in Table 3, in a write operation for writing data "1" or data "0" into the two-port SRAM cell, the respective "Write/Read Word-line" (which will be word-line W-WL in FIG. 18) in Table 3 is applied with a voltage equal to Vss−ΔV5, which is a voltage lower than power supply voltage Vss. In some embodiments, voltage difference ΔV5 is greater than about 30 mV, although it may have a different value. The remaining voltages applied on other voltage lines for the write operation may be regular Vdd(1) voltage or Vss(0) voltage.

In a read operation for reading data out of the two-port SRAM cell, the respective "Write/Read Word-line" (which will be word-line R-WL in FIG. 18) in Table 3 is applied with a voltage equal to Vss−ΔV5, which is a voltage lower than power supply voltage Vss. The remaining voltages applied on other voltage lines as shown in Table 3 may be regular Vdd(1) voltage or Vss(0) voltage. Again, by reducing the voltage on the respective word-lines in read operations and write operations, the operation speed and reliability may be improved.

Table 4 lists the exemplary voltages applied on the voltage lines that are connected to single-port, two-port, or dual-port SRAM cells in a standby mode. Accordingly, the voltages listed in Table 4 correspond to FIGS. 1 and 11-21. The correspondence between the voltage lines in Table 4 and the voltage lines in FIGS. 11-21 depend on whether the respective SRAM cells are single-port SRAM cells, two-port SRAM cells, or dual-port SRAM cells. The correspondence between the voltage lines in Table 4 and the voltage lines in FIGS. 11-21 are the same as for Tables 1-3, and hence are not repeated herein.

TABLE 4

| Single-Port, Two-Port, and Dual-Port Operations | | Bit-line | Bit-line Bar | Write/Read Word-line | CVss-line | CVdd-line |
|---|---|---|---|---|---|---|
| Standby Mode | approach 1 | Vdd(1) | Vss(0) | Vss(0) | Vss(0) | Vdd − ΔV6 |
| | approach 2 | Vss(0) | Vdd(1) | Vss(0) | Vdd + ΔV7 | Vdd(1) |

As shown in Table 4, in approach 1 for the standby mode, the voltage on CVdd-line is reduced to Vdd−ΔV6, which is a voltage lower than power supply voltage Vdd. In some embodiments, voltage difference ΔV6 is greater than about 30 mV, or greater than about 200 mV, although it may have a different value. Alternatively or simultaneously, as shown in approach 2, the voltage on CVss-line is increased to Vss+ΔV7, which is a voltage higher than power supply voltage Vss and lower than voltage Vdd. In some embodiments, voltage difference ΔV7 is greater than about 50 mV, although it may have a different value. The remaining voltages applied on other voltage lines may be regular Vdd(1) voltage or Vss(0) voltage. By increasing the voltage on CVdd-line or reducing the voltage on CVss-line, the power consumption may be reduced.

In accordance with some embodiments, the CVss-lines for different SRAM cells in a same SRAM cells array may need to have different voltages. Accordingly, in accordance with some embodiments, the CVss-lines as shown in FIGS. 11-21 are de-coupled from the underlying p-well regions (for example, in FIGS. 15-18), so that the voltages of the CVss-lines are not tied to the same voltages of the P-well regions. On the other hand, since CVdd-lines (such as CVdd-line, CVdd-line-1, and/or CVdd-line-2) in FIGS. 11-21 remain to be the same regardless of the operations, the CVdd-lines may be connected to, and have the same voltages as, the underlying N-well regions (for example, in FIGS. 15-18).

Figure 22:
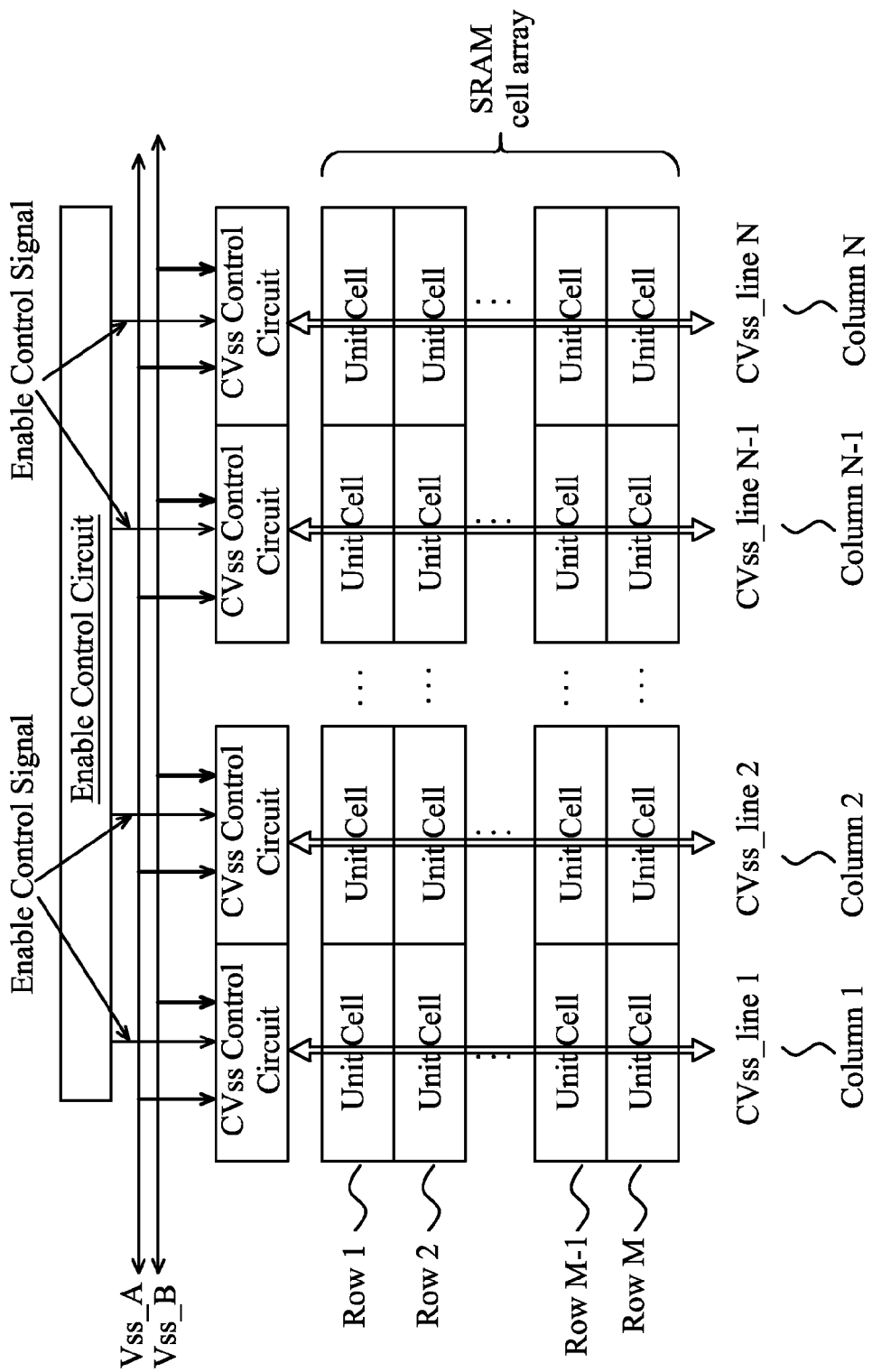
FIGS. 22 and 23 illustrate circuits for generating and distributing Vss voltages and modified Vss voltages to an SRAM array in accordance with some exemplary embodiments.
Figure 23:
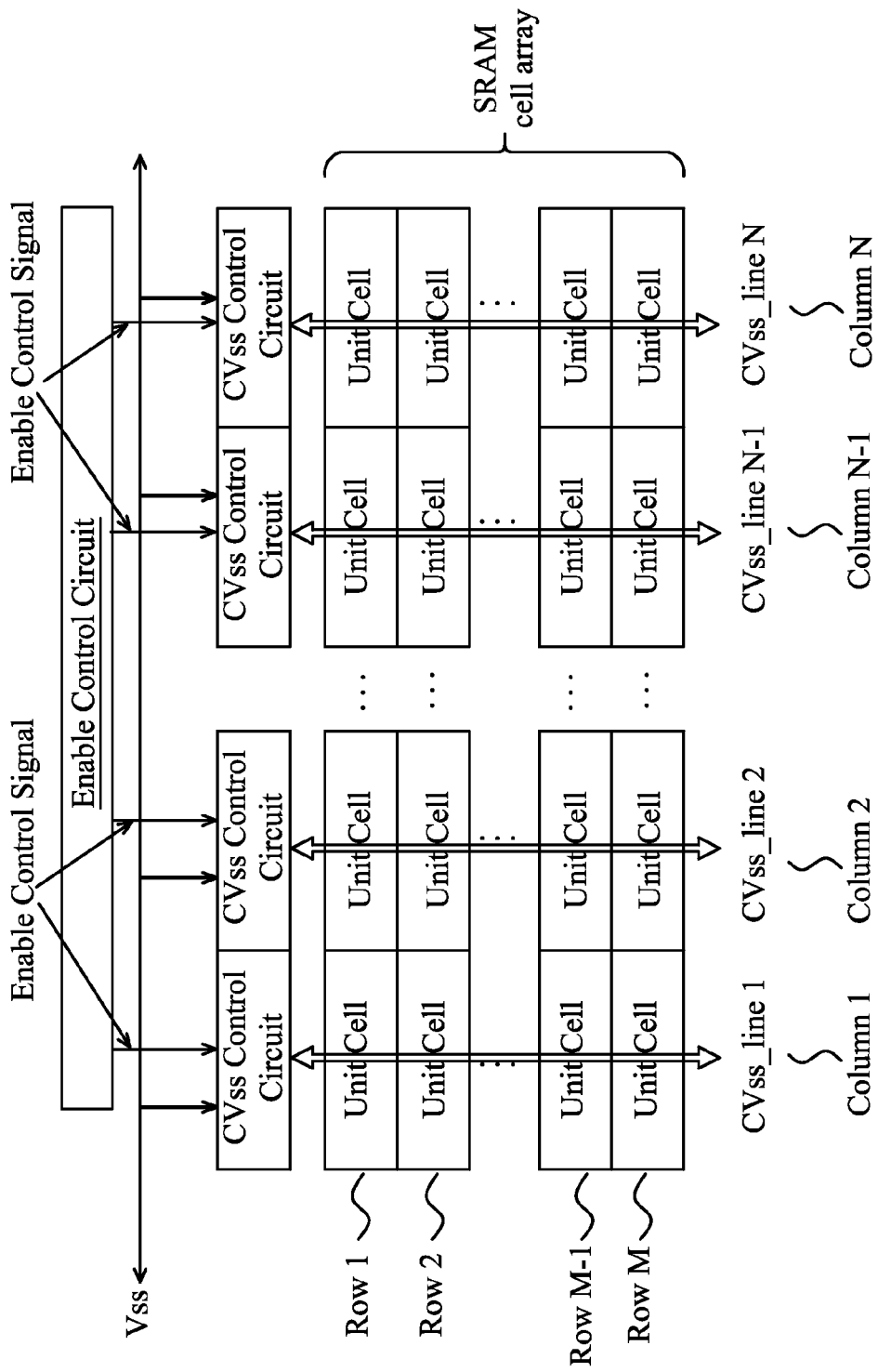

FIGS. 22 and 23 illustrate how Vss voltages and modified Vss in Tables 1 through 4 are generated and provided to SRAM cells. In FIGS. 22 and 23, two voltages Vss_A and Vss_B are applied to SRAM cells through buses. Each of the voltages Vss_A and Vss_B may be a Vss(0) voltage or a modified Vss voltage, wherein the modified Vss voltage may be one of, for example, Vss+ΔV1 (Table 1), Vss−ΔV4 (Table 1), Vss+ΔV3 (Tables 1 and 2), and Vss+ΔV7 (Table 4). In accordance with the embodiments in FIG. 22, voltages Vss_A and Vss_B are generated and passed to the illustrated SRAM cell array. The SAM cell array includes a plurality of unit cells, which may be single-port SRAM cells, two-port SRAM cells, or dual-port SRAM cells, as shown in FIGS. 1 and 11-21. The SRAM cell array includes a plurality of rows, namely row 1 through row M, and a plurality of columns, namely column 1 through column N. Each column is connected to a CVss control circuit, which is configured to pass one of voltages Vss_A and Vss_B to the SRAM cells in the respective column. The selection of voltages Vss_A and Vss_B is in response to the enable control signals provided by an enable control circuit. The enable control circuit may generate the enable control signals for each of the CVss control circuits. The enable control signals are determined by various factors, including, for example, what operation (read or write) is performed, whether the SRAM cell array is in the standby mode, whether the column is in dummy read, and whether data "1" or data "0" is being written into. The Vss voltage and the modified Vss voltage in Tables 1 through 4 are thus supported by the circuit in FIG. 22.

The circuit in FIG. 23 is essentially the same as in FIG. 22, except that the CVss control circuits of each column generates an appropriate voltage from the received power supply voltage Vss, wherein the generated voltage may be Vss itself, or may be the modified Vss voltage. Again, the type of generated voltage may depend on the enable control signal provided by the enable control circuit, which has the same function as in FIG. 22.

Figure 24:
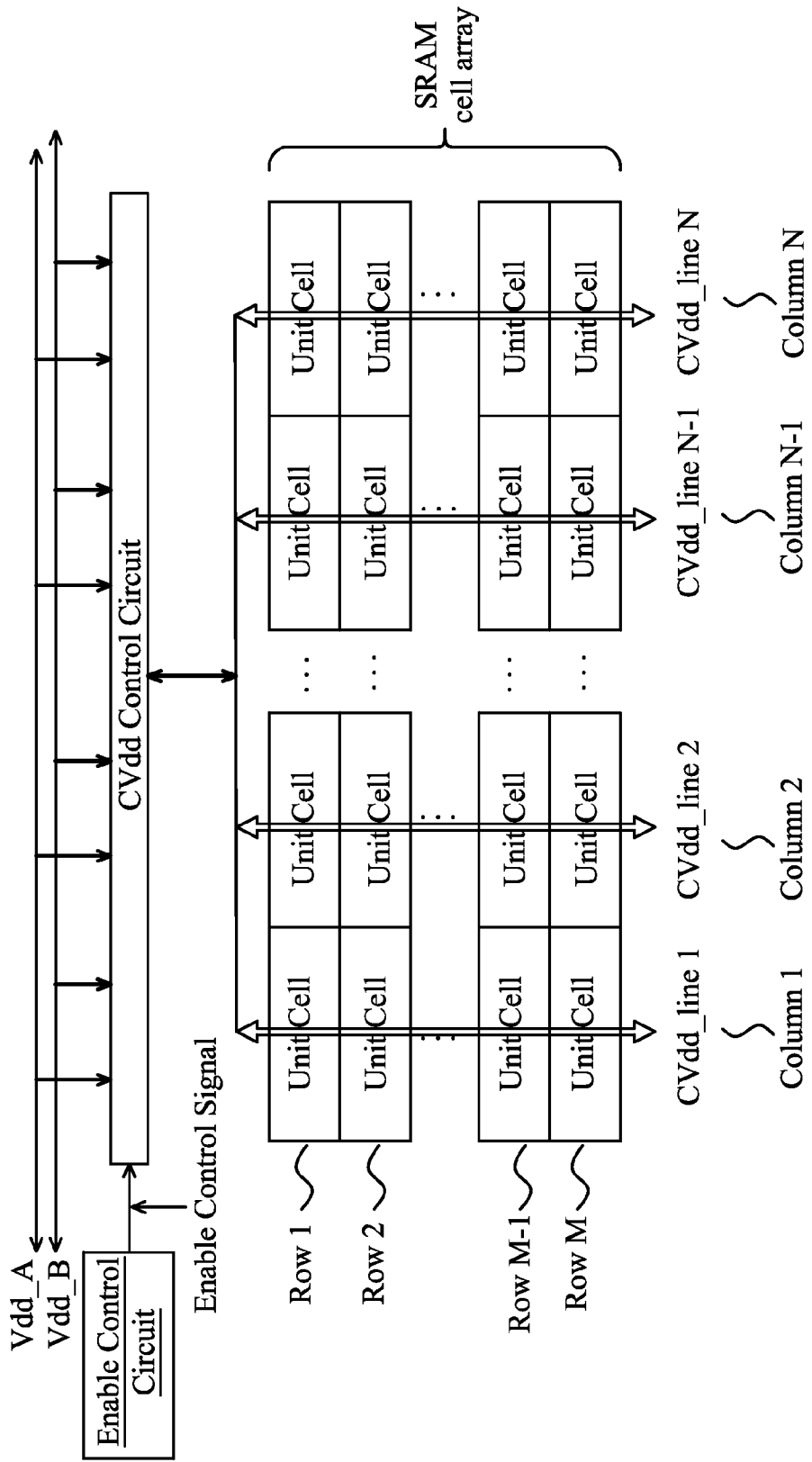
FIGS. 24 and 25 illustrate circuits for generating and distributing Vdd voltages and modified Vdd voltages to an SRAM array in accordance with some exemplary embodiments.
Figure 25:
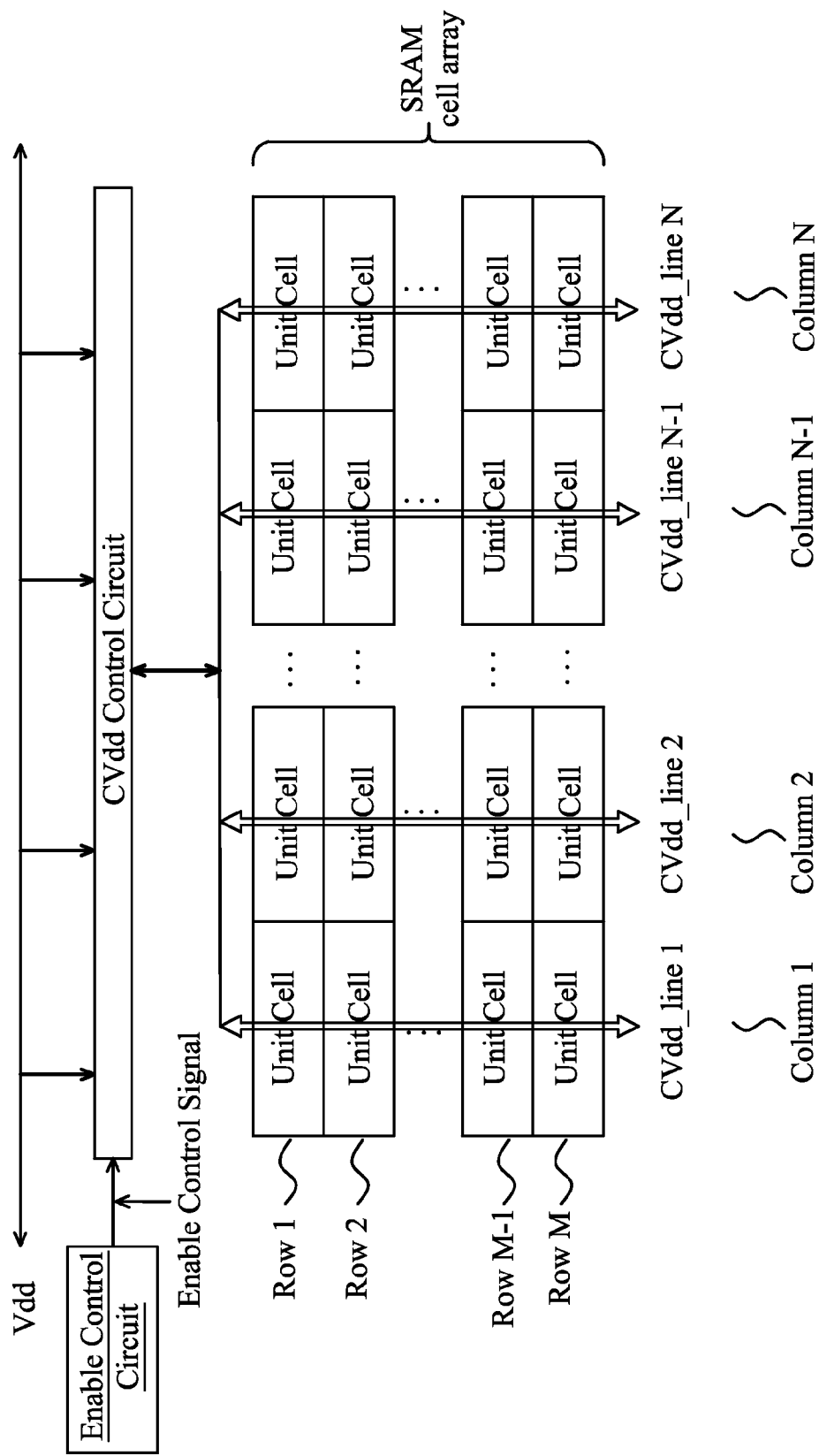

FIGS. 24 and 25 illustrate how Vdd voltages and the modified Vdd voltages in Tables 1 through 4 are generated and provided to an SRAM cell array. In FIGS. 24 and 25, two voltages Vdd_A and Vdd_B are applied to SRAM cells. Each of voltages Vdd_A and Vdd_B may be a Vdd (1) voltage or a modified Vdd voltage, wherein the modified Vdd voltage may include, for example, Vdd−ΔV6 (Table 4). In accordance with the embodiments in FIG. 24, voltages Vdd_A and Vdd_B are generated and passed to the illustrated SRAM cell array. A common CVdd control circuit is shared by a plurality of columns, and possibly by all columns, of the SRAM cells array. The CVdd control circuit is configured to pass one of voltages Vdd_A and Vdd_B to the plurality of columns of SRAM cells, for example, depending on whether the operation mode is standby mode or not. The enable control circuit may generate the enable control signal, which is used to control the CVdd control circuit to generate an appropriate voltage. The Vdd(1) voltage and the modified Vdd voltages in Tables 1 through 4 are thus supported by the circuit in FIG. 24.

The circuit in FIG. 25 is essentially the same as that in FIG. 24, except that the CVdd control circuit generates an appropriate voltage from the received power voltage Vdd(1), wherein the generated Vdd voltage may be Vdd(1) itself, or may be the modified Vdd voltage. Again, the type of generated voltage may depend on the received enable control signals provided by the enable control circuit, which has the same function as in FIG. 24.

Figure 26:
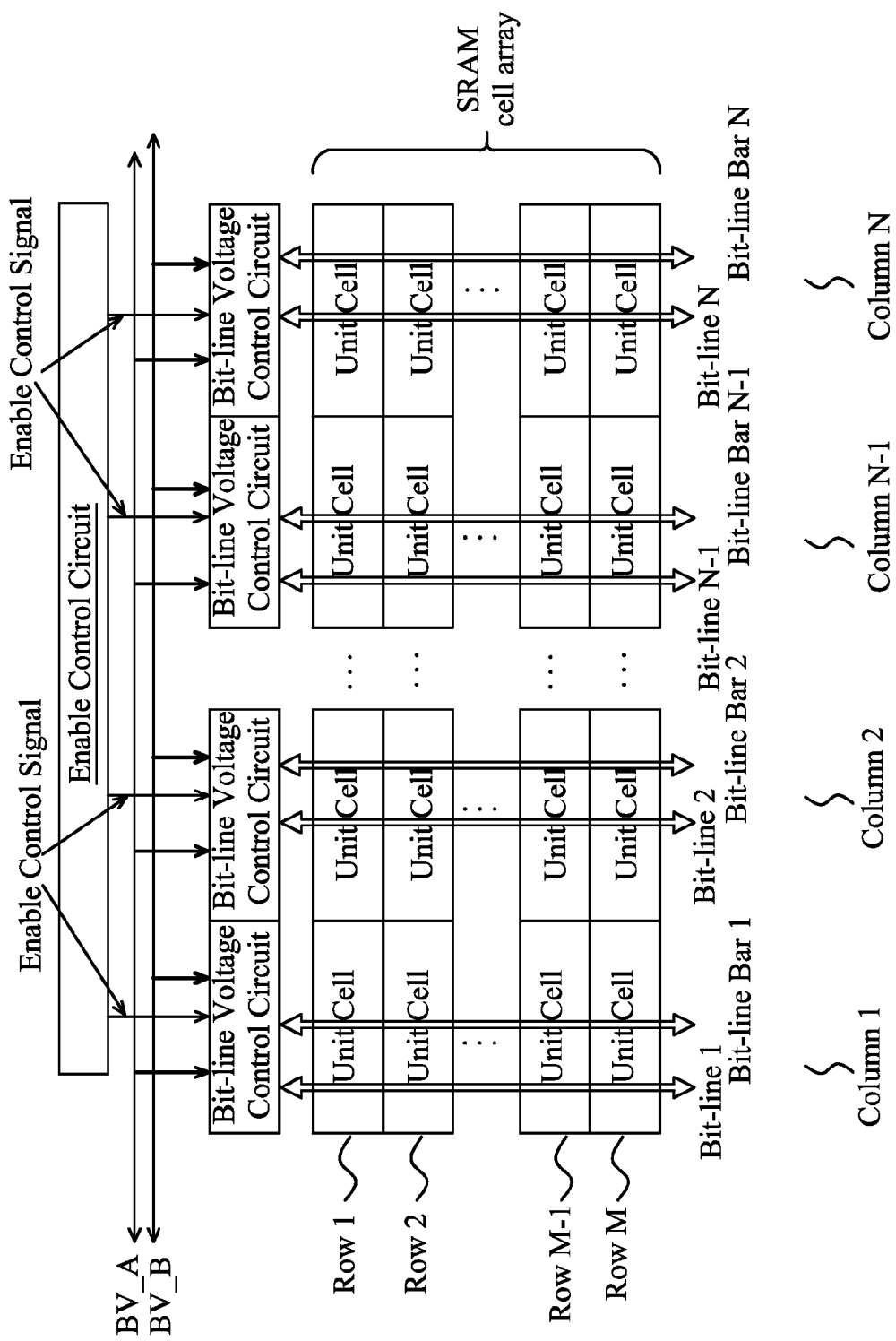
FIGS. 26 and 27 illustrate circuits for applying a voltage difference to a bit-line.
Figure 27:
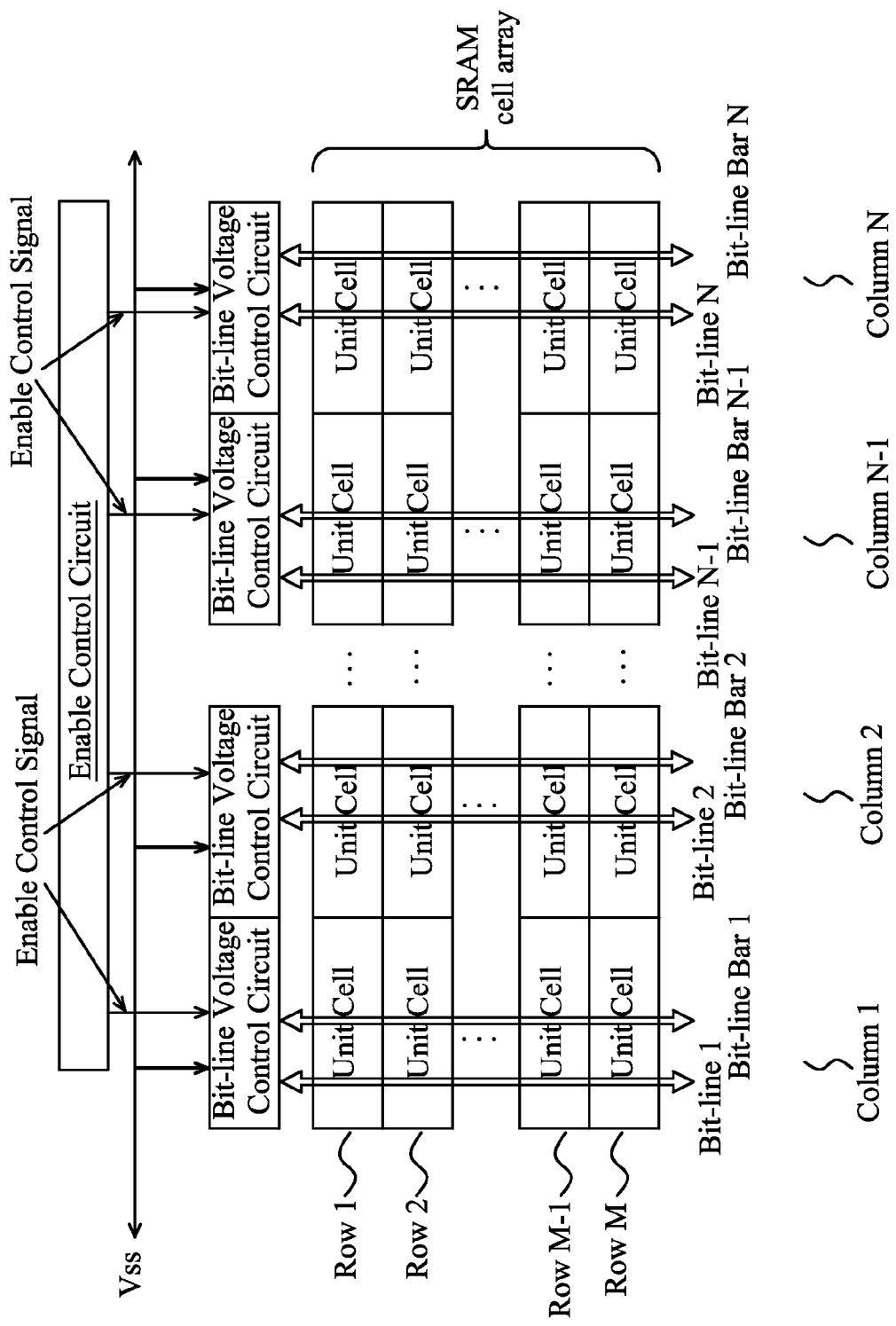

FIGS. 26 and 27 illustrate how different bit-line voltages in Tables 1 through 3 are generated and provided to an SRAM cell array. In FIG. 26, voltages BL_A and BL_B are passed in from buses, and are different from each other. One of Voltages BL_A and BL_B may be Vdd+ΔV2 (Tables 1 and 2), and the other may be Vss(0). The bit-lines of each of the columns are connected to one of Bit-line voltage control circuits, which is configured to select voltages BL_A and BL_B (or more), and pass to appropriate Bit-line and Bit-line Bar according to the scheme in Tables 1 and 2. Although FIGS. 26 and 27 illustrate two bit lines for each column, there may be more bit-lines if the SRAM cell array includes two-port SRAM cells or dual-port SRAM cells, as shown in FIGS. 18, 20, and 21. FIG. 27 illustrates a similar circuit, except different bit-line voltages are generated by bit-line voltage control circuits, instead of being passed from outside.

Figure 28:
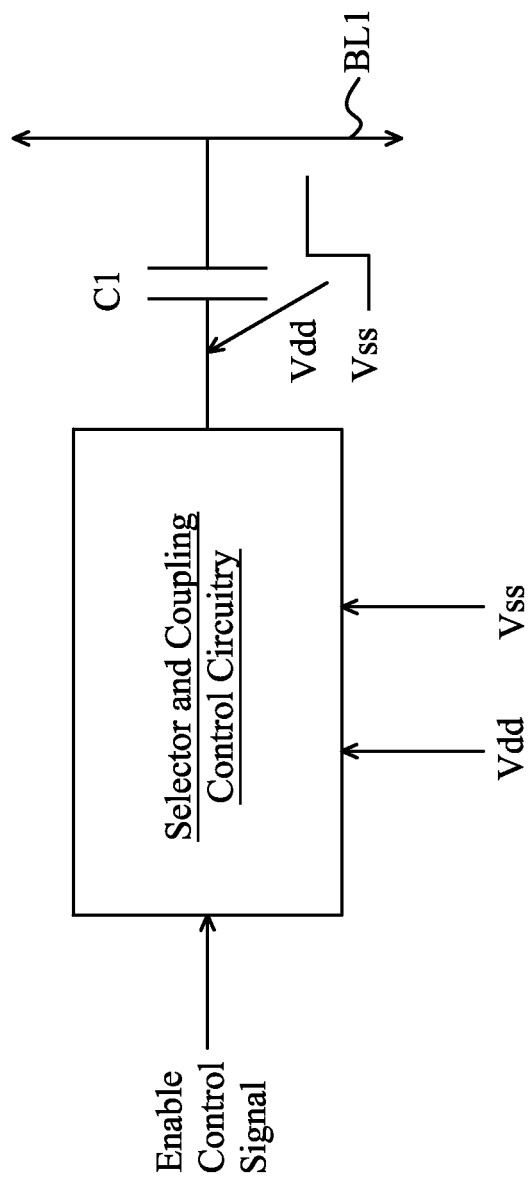
FIG. 28 illustrates a circuit for generating a voltage difference, which may be used for generating the modified Vss voltages and the modified Vdd voltages.

FIG. 28 illustrates an exemplary circuit for generating a modified bit-line voltage (such as Vdd+ΔV2 (Tables 1 and 2)). It is noted that the present disclosure includes many ways for increasing or reducing a Vss voltage or a Vdd voltage, and FIG. 28 illustrates one of the examples. The illustrated circuit may be a part of the Bit-line voltage control circuits in FIGS. 26 and 27. The circuit includes a selector and coupling control circuitry, which is coupled to bit-line BL1 through capacitor C1. The Bit-line BL1 may be any of the bit-line and bit-line bar in Tables 1 and 3. The selector and coupling control circuitry receives enable control signals from the enable control circuit (FIGS. 26 and 27). Initially, it is assumed that the selector and coupling control circuitry outputs voltage Vss. Bit-line BL1 may have voltage Vdd at this time. Next, in response to the enable control signal, the selector and coupling control circuitry pass a rapid pulse to increase the output to Vdd. Since bit-line BL1 has a capacitance, due to capacitor C1 and the capacitance of bit-line BL1, a voltage difference ΔV2 is generated and added to the original voltage Vdd on bit-line BL1. The magnitude of the voltage difference is related to the capacitance of capacitor C1 and the capacitance of bit-line BL1.

In accordance with the exemplary embodiments of the present disclosure, by adopting p-type pass-gate FinFETs, strong drive currents Ion can be obtained, and the speed of the respective SRAM cell is improved. The embodiments have good resistance to alpha-particle induced errors. The raised SiGe epitaxy regions for the source and drain regions of the FinFETs in the SRAM cells may result in a low contact resistance, and hence the drive currents Ion are further boosted. The landing margin for the contact plugs to land on the source and drain regions is also improved by using raised SiGe epitaxy regions. By adjusting the voltages on Bit-line, Bit-line Bar, Word-line, and the CVss-line voltage, the read and write speed may be increased, and the read and write reliability may be improved. The power consumption of the SRAM cells may also be reduced by increasing the voltage on CVss-line, or reducing the voltage on CVdd-line.

In accordance with some embodiments, a circuit includes an SRAM array. An SRAM cell is in the SRAM array and includes a p-well region, a first and a second n-well region on opposite sides of the p-well region, and a first and a second pass-gate FinFET. The first pass-gate FinFET and the second pass-gate FinFET are p-type FinFETs. A CVss line is over the p-well region, wherein the CVss line is parallel to an interface between the p-well region and the first n-well region. A bit-line and a bit-line bar are on opposite sides of the CVss line. A CVdd line crosses over the SRAM cell. A CVss control circuit is connected to the CVss line. The CVss control circuit is configured to provide a first CVss voltage and a second CVss voltage to the CVss line, with the first and the second CVss voltage are different from each other.

In accordance with other embodiments, a circuit includes an SRAM array having a plurality of rows and columns of SRAM cells. Each of the SRAM cells includes a p-well region, a first and a second n-well region on opposite sides of the p-well region, and a first pass-gate FinFET and a second pass-gate FinFET. The first pass-gate FinFET and the second pass-gate FinFET are p-type FinFETs. A CVss line is over the p-well region. A bit-line and a bit-line bar are on opposite sides of the CVss line. A CVdd line crosses over the SRAM cell. A CVdd control circuit is connected to the CVdd line. The CVdd control circuit is configured to provide a first CVdd voltage and a second CVdd voltage to the CVdd line. With the first CVdd voltage and the second CVdd voltage being different from each other.

In accordance with yet other embodiments, a method includes performing a first operation on as SRAM array by supplying a Vss voltage to a CVss line of the SRAM array. The SRAM array has a plurality of rows and a plurality of columns of SRAM cells. Each of the SRAM cells includes a p-well region, a first and a second n-well region on opposite sides of the p-well region, and a first pass-gate FinFET and a second pass-gate FinFET in the first n-well region and the second n-well region, respectively. The first pass-gate FinFET and a second pass-gate FinFET are p-type FinFETs. The method further includes performing a second operation on the SRAM array by supplying a modified Vss voltage to the CVss line, wherein the Vss voltage and the modified Vss voltage are different from each other.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method comprising:
    performing a first operation on a Static Random Access Memory (SRAM) array by supplying a Vss voltage to a CVss line of the SRAM array, wherein the SRAM array comprises a plurality of rows and a plurality of columns of SRAM cells, each comprising:
        a p-well region;
        a first and a second n-well region on opposite sides of the p-well region; and
        a first pass-gate FinFET and a second pass-gate FinFET in the first n-well region and the second n-well region, respectively, wherein the first pass-gate FinFET and the second pass-gate FinFET are p-type FinFETs; and
    performing a second operation on the SRAM array by supplying a modified Vss voltage to the CVss line, wherein the Vss voltage and the modified Vss voltage are different from each other, and wherein during the first operation and the second operation, voltages of the p-well region are different from the Vss voltage and the modified Vss voltage, respectively.

2. The method of claim 1, wherein the first operation is a read operation, and the second operation is a write operation, and wherein the Vss voltage is lower than the modified Vss voltage.

3. The method of claim 2, wherein the Vss voltage is lower than the modified Vss voltage by more than about 30 mV.

4. The method of claim 1 further comprising, during a standby mode of the SRAM array, increasing a voltage on the CVss line to a third voltage greater than the Vss voltage.

5. The method of claim 1, wherein the Vss voltage is an electrical ground voltage.

6. The method of claim 1, wherein the second operation is a write operation writing data "1," and the modified Vss voltage is higher than an electrical ground voltage.

7. The method of claim 1, wherein the second operation is a write operation writing data "0," and the modified Vss voltage is higher than an electrical ground voltage.

8. The method of claim 1, wherein the second operation is a read operation, and the modified Vss voltage is lower than an electrical ground voltage.

9. A method comprising:
    performing a first operation on a Static Random Access Memory (SRAM) array by supplying a Vss voltage to a CVss line of the SRAM array, wherein the SRAM array comprises a plurality of rows and a plurality of columns of SRAM cells, each comprising:
        a p-well region; and
        a first pull-down FinFET and a second pull-down FinFET in the p-well region; and
    performing a second operation on the SRAM array by supplying a modified Vss voltage to the CVss line, wherein the Vss voltage and the modified Vss voltage are different from each other, and wherein during the first operation and the second operation, voltages of the p-well region are different from the Vss voltage and the modified Vss voltage, respectively.

10. The method of claim 9, wherein the SRAM cell further comprises:
    a first and a second n-well region on opposite sides of the p-well region; and
    a first pass-gate FinFET and a second pass-gate FinFET in the first n-well region and the second n-well region, respectively, wherein the first pass-gate FinFET and the second pass-gate FinFET are p-type FinFETs.

11. The method of claim 9, wherein the first operation is a read operation, and the second operation is a write operation, and wherein the Vss voltage is lower than the modified Vss voltage.

12. The method of claim 9, wherein the Vss voltage is lower than the modified Vss voltage by more than about 30 mV.

13. The method of claim 9 further comprising, during a standby mode of the SRAM array, increasing a voltage on the CVss line to a third voltage greater than the Vss voltage.

14. The method of claim 9, wherein the Vss voltage is an electrical ground voltage.

15. The method of claim 9, wherein the second operation is a write operation writing data "1," and the modified Vss voltage is higher than an electrical ground voltage.

16. The method of claim 9, wherein the second operation is a write operation writing data "0," and the modified Vss voltage is higher than an electrical ground voltage.

17. A method comprising:
    performing a read operation on a Static Random Access Memory (SRAM) array by supplying a first voltage to a CVss line of the SRAM array, wherein the SRAM array comprises a plurality of rows and a plurality of columns of SRAM cells, each comprising:
        a p-well region;
        a first and a second n-well region on opposite sides of the p-well region; and
        a first pass-gate FinFET and a second pass-gate FinFET in the first n-well region and the second n-well region, respectively, wherein the first pass-gate FinFET and the second pass-gate FinFET are p-type FinFETs; and
    performing a write operation on the SRAM array by supplying a second voltage higher than the first voltage to the CVss line, wherein during the read operation and the write operation, voltages of the p-well region are different from the first voltage and the second voltage, respectively.

18. The method of claim 17, wherein the first voltage is lower than an electrical ground voltage.

19. The method of claim 17, wherein the second voltage is higher than an electrical ground voltage.

20. The method of claim 17 further comprising:
    during the read operation, supplying a third voltage to a CVdd line of the SRAM array; and
    during the write operation, supplying a fourth voltage equal to the third voltage to the CVdd line of the SRAM array.

* * * * *